US010755996B2

(12) United States Patent
Maekawa et al.

(10) Patent No.: US 10,755,996 B2
(45) Date of Patent: Aug. 25, 2020

(54) THROUGH ELECTRODE SUBSTRATE AND MANUFACTURING METHOD THEREOF

(71) Applicant: DAI NIPPON PRINTING CO., LTD., Tokyo-to (JP)

(72) Inventors: Shinji Maekawa, Tokyo-to (JP); Hiroshi Mawatari, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 16/075,898

(22) PCT Filed: Feb. 3, 2017

(86) PCT No.: PCT/JP2017/003892
§ 371 (c)(1),
(2) Date: Nov. 13, 2018

(87) PCT Pub. No.: WO2017/135395
PCT Pub. Date: Aug. 10, 2017

(65) Prior Publication Data
US 2019/0080977 A1    Mar. 14, 2019

(30) Foreign Application Priority Data

Feb. 5, 2016 (JP) .................................. 2016-021288

(51) Int. Cl.
*H05K 1/11* (2006.01)
*H05K 3/46* (2006.01)
(Continued)

(52) U.S. Cl.
CPC ........ *H01L 23/32* (2013.01); *H01L 23/49827* (2013.01); *H05K 1/115* (2013.01);
(Continued)

(58) Field of Classification Search
CPC ........................................................ H01L 23/32
See application file for complete search history.

(56) References Cited

U.S. PATENT DOCUMENTS

| 2004/0087064 | A1* | 5/2004 | Lee ......................... H01L 27/12 438/128 |
| 2005/0018097 | A1* | 1/2005 | Kwon ............... G02F 1/136227 349/43 |

(Continued)

FOREIGN PATENT DOCUMENTS

| JP | 2001-160601 A | 6/2001 |
| JP | 2004-31812 A | 1/2004 |

(Continued)

OTHER PUBLICATIONS

Aug. 22, 2017 Office Action issued in Japanese Patent Application No. 2016-021288.

(Continued)

*Primary Examiner* — William A Harriston
(74) *Attorney, Agent, or Firm* — Oliff PLC

(57) ABSTRACT

A through electrode substrate includes: a substrate; a first electrode part provided on a first surface side of the substrate; and a second electrode part provided on a second surface side of the substrate. The plurality of holes includes a plurality of first holes and a plurality of second holes. The hole electrode part of each first hole is electrically connected to the first electrode part on the first surface side of the substrate, and the hole electrode part thereof is electrically connected to the second electrode part on the second surface side of the substrate. The electrode part of each second hole is electrically insulated from the first electrode part on the first surface side of the substrate, or the hole electrode part thereof is electrically insulated from the second electrode part on the second surface side of the substrate.

11 Claims, 18 Drawing Sheets

(51) Int. Cl.
*H05K 3/42* (2006.01)
*H01L 23/32* (2006.01)
*H01L 23/498* (2006.01)
*H01L 25/065* (2006.01)

(52) U.S. Cl.
CPC ............... *H05K 1/116* (2013.01); *H05K 3/46* (2013.01); *H05K 3/4605* (2013.01); *H01L 25/0657* (2013.01); *H01L 2224/16227* (2013.01); *H01L 2224/17181* (2013.01); *H01L 2225/06517* (2013.01); *H01L 2225/06548* (2013.01); *H01L 2225/06572* (2013.01); *H05K 3/42* (2013.01); *H05K 3/4602* (2013.01); *H05K 2201/09781* (2013.01); *H05K 2201/10378* (2013.01)

(56) References Cited

U.S. PATENT DOCUMENTS

| | | | | |
|---|---|---|---|---|
| 2008/0061402 | A1* | 3/2008 | Ishihara | H01L 21/76898 257/621 |
| 2013/0313687 | A1* | 11/2013 | Bonkohara | H01L 21/76898 257/621 |
| 2018/0190707 | A1* | 7/2018 | Lee | H01L 27/14645 |

FOREIGN PATENT DOCUMENTS

| | | |
|---|---|---|
| JP | 2006-202819 A | 8/2006 |
| JP | 2010-252095 A | 11/2010 |
| JP | 2011-003925 A | 1/2011 |
| JP | 2014-132690 A | 7/2014 |
| JP | 2014-192432 A | 10/2014 |
| JP | 2015-170784 A | 9/2015 |
| JP | 2015-207580 A | 11/2015 |
| JP | 2015-211147 A | 11/2015 |
| JP | 2015211147 A * | 11/2015 |

OTHER PUBLICATIONS

Sep. 29, 2017 Office Action issued in Japanese Patent Application No. 2016-021288.
Mar. 30, 2018 Office Action issued in Japanese Patent Application No. 2017-088896.
Oct. 4, 2019 Office Action issued in Japanese Patent Application No. 2018-000807.
Jul. 19, 2019 Office Action issued in Taiwanese Patent Application No. 106103724.
Apr. 18, 2017 International Search Report issued in International Patent Application No. PCT/JP2017/003892.
Aug. 7, 2018 International Preliminary Report on Patentability issued in International Patent Application No. PCT/JP2017/003892.
May 22, 2020 Office Action issued in Japanese Patent Application No. 2018-000807.

* cited by examiner

THROUGH ELECTRODE SUBSTRATE AND MANUFACTURING METHOD THEREOF

BACKGROUND OF THE INVENTION

Field of the Invention

The embodiment of this disclosure relates to a through electrode substrate and a manufacturing method thereof.

Background Art

A member so-called through electrode substrate, which includes a substrate having a first surface and a second surface, a plurality of holes provided in the substrate, and an electrode part provided inside each hole to extend from the first surface side to reach the second surface side, is used for various purposes. For example, Patent Document 1 discloses an example wherein a through electrode substrate is used as an interposer interposed between two LSI chips, when a plurality of LSI chips are stacked in order to increase a packaging density. In addition, a through electrode substrate is sometimes interposed between an element such as an LSI chip and a printed circuit board such as a motherboard. In the following description, an electrode part provided inside a hole is sometimes referred to as "hole electrode part".

Patent Document

Patent Document 1: JP2011-3925A

SUMMARY OF THE INVENTION

When a hole is provided in a substrate, rigidity of the substrate lowers in an area where the hole is provided. As a result, the substrate is easily deformed in the area where the hole is provided. In other words, the rigidity and the deformability vary depending on an area of the substrate where a hole is provided, and on an area of the substrate where a hole is not provided. When the rigidity and the deformability of the substrate vary from place to place, the substrate is likely to be warped and/or distorted. Thus, when a substrate is provided with a plurality of holes, holes are preferably arranged such that a hole distribution density in a plane of the substrate is uniform.

On the other hand, holes of a through electrode substrate are provided in accordance with a layout of terminals of an element such as an LSI chip. Thus, when the layout of the terminals of the element is uneven, the layout of holes in the through electrode substrate becomes also uneven. For example, the hole distribution density in the through electrode substrate is non-uniform. As a result, the through electrode substrate may have a defect such as warp and/or distortion.

The embodiment of this disclosure has been made in view of the circumstances. The object thereof is to provide a through electrode substrate and a manufacturing method thereof capable of inhibiting a substrate from warping and/or distorting.

An embodiment of this disclosure is a through electrode substrate comprising: a substrate including a first surface and a second surface positioned oppositely to the first surface, the substrate being provided with a plurality of holes; a hole electrode part provided inside each of the holes of the substrate; a first electrode part provided on a first surface side of the substrate; and a second electrode part provided on a second surface side of the substrate, wherein: the plurality of holes include a plurality of first holes and a plurality of second holes; the hole electrode part of each first hole is electrically connected to the first electrode part on the first surface side of the substrate, and the hole electrode part thereof is electrically connected to the second electrode part on the second surface side of the substrate; and the hole electrode part of each second hole is electrically insulated from the first electrode part on the first surface side of the substrate, or the hole electrode part thereof is electrically insulated from the second electrode part on the second surface side of the substrate.

In the through electrode substrate according to the embodiment of this disclosure, the hole electrode part of each second hole may be electrically insulated from the first electrode part on the first surface side of the substrate, and the hole electrode part thereof may be electrically insulted from the second electrode part on the second surface side of the substrate.

The through electrode substrate according to the embodiment of this disclosure may include a first insulation layer provided on the first surface side of the substrate, and a second insulation layer provided on the second surface side of the substrate; and the second holes may be covered with the first insulation layer on the first surface side of the substrate, or may be covered with the second insulation layer on the second surface side of the substrate.

In the through electrode substrate according to the embodiment of this disclosure, the hole electrode part may include an electroconductive layer provided on a sidewall of the hole; and the through electrode substrate may further comprise a filling member provided inside the hole, the filling member being nearer to a center side of the hole than the hole electrode part.

The through electrode substrate according to the embodiment of this disclosure may include the first insulation layer provided on the first surface side of the substrate, and the second insulation layer provided on the second surface side of the substrate; and at least one or more filling members of the filling members provided in the second holes may be connected to the first insulation layer or the second insulation layer.

An embodiment of this disclosure is a manufacturing method of a through electrode substrate on which an element having a plurality of terminals is mounted, the manufacturing method comprising: a step of preparing a substrate including a first surface and a second surface positioned oppositely to the first surface; a positioning step of determining positioning of a plurality of holes to be formed in the substrate; a hole forming step of forming the plurality of holes in the substrate, based on the positioning determined in the positioning step; and a hole-electrode-part forming step of forming a hole electrode part inside each of the plurality of holes; wherein the positioning step includes a first positioning step of determining positioning of a plurality of first holes to be electrically connected to the terminals of the element, and a second positioning step of determining positioning a plurality of second holes not to be electrically connected to the terminals of the element.

According to the embodiments of this disclosure, it is possible to provide a through hole electrode capable of inhibiting generation of warpage and/or distortion.

DETAILED DESCRIPTION OF THE INVENTION

Figure 1:
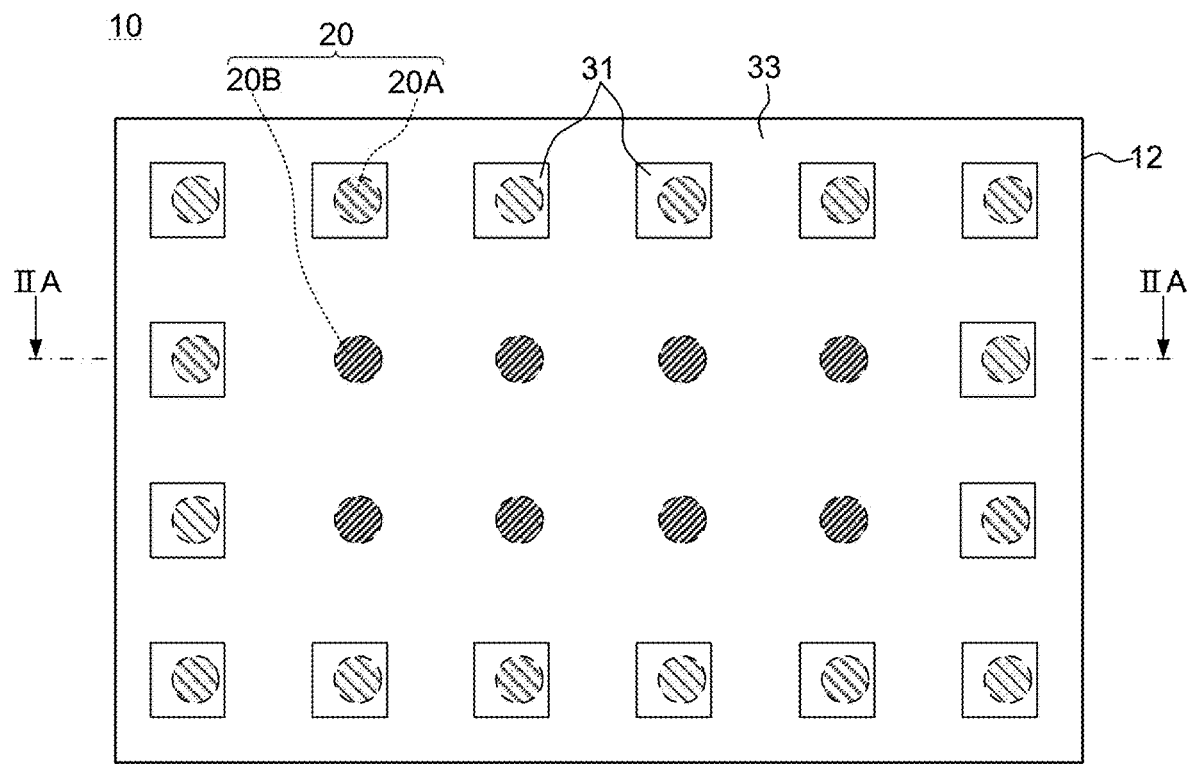
FIG. 1 is a plan view showing a through electrode substrate according to a first embodiment.

Herebelow, a structure of a through electrode substrate according to embodiments of this disclosure and a manufacturing method thereof are described in detail with reference to the drawings. The below embodiments are mere examples of the embodiments of this disclosure, and this disclosure should not be construed to be limited to these embodiments. In this specification, the terms "substrate", "base member", "sheet" and "film" are not differentiated from one another, based only on the difference of terms. For example, the "substrate" or the "base member" is a concept including a member that can be referred to as sheet or film. Further, terms specifying shapes, geometric conditions and their degrees, e.g., terms such as "parallel", "perpendicular", etc. and values of a length and a value, etc., are not limited to their strict definitions, but should be construed to include a range capable of exerting a similar function. In addition, in the drawings referred in the embodiments, the same parts or parts having a similar function have the same reference number or similar reference number, and repeated description may be omitted. In addition, a scale size may be different from the actual one, for the convenience of easiness in illustration and understanding, and a part of a structure may be omitted from the drawings.

First Embodiment

A first embodiment is described with reference to FIGS. 1 to 3G.

Through Electrode Substrate

Figure 2A:
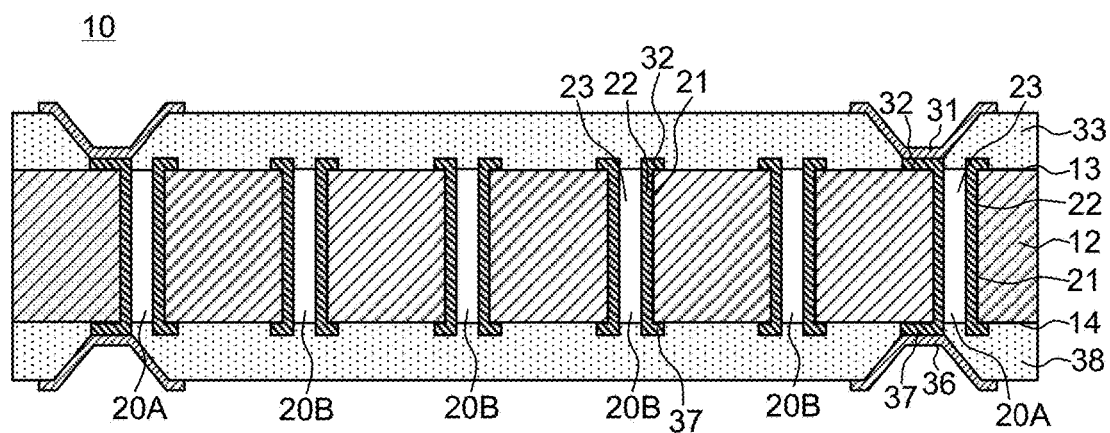
FIG. 2A is a sectional view of the through electrode substrate of FIG. 1 seen from a IIA-IIA direction.

Firstly, a through electrode substrate 10 according to the embodiment is described with reference to FIGS. 1 and 2A. FIG. 1 is a plan view showing the through electrode substrate 10. FIG. 2A is a sectional view of the through electrode substrate 10 of FIG. 1 cut along one-dot chain lines, which is seen from a IIA-IIA direction.

The through electrode substrate 10 comprises a substrate 12, a plurality of holes provided in the substrate 12, and hole electrode parts 22 provided inside the holes. As described later, the holes at least include two types of holes of a first hole 20A and a second hole 20B. In the below description, when structures applicable both to the first hole 20A and the second hole 20B, the first hole 20A and the second hole 20B are referred to as holes 20 as a general term.

In addition, the through electrode substrate 10 further comprises a first electrode part 31, a first wiring 32 and a first insulation layer 33, which are provided on the side of a first surface 13 of the substrate 12, as well as a second electrode part 36, a second wiring 37 and a second insulation layer 38, which are provided on the side of a second surface 14 of the substrate 12.

The respective constituent elements of the through electrode substrate 10 are described herebelow.

(Substrate)

The substrate includes the first surface 13 and the second surface 14 positioned oppositely to the first surface 13. The substrate 12 is made of a material having a certain insulation property. For example, the substrate 12 may be a glass substrate, a quartz substrate, a sapphire substrate, a resin substrate, a silicon substrate, a silicon carbide substrate, an alumina ($Al_2O_3$) substrate, a aluminum nitride (AlN) substrate, a zirconium oxide ($ZrO_2$) substrate and so on, or a substrate made by stacking these substrates. The substrate 12 may include a substrate made of an electroconductive material, such as an aluminum substrate, a stainless substrate and so on.

A thickness of the substrate 12 is not particularly limited, but the use of the substrate 12 having a thickness of not less than 100 μm and not more than 800 μm is preferred. More preferably, the substrate 12 has a thickness of not less than 200 μm and not more than 600 μm. When the substrate 12 has a thickness of not less than 100 μm, warpage of the substrate 12 can be inhibited from increasing. Thus, it can be inhibited that handling of the substrate 12 during a manufacturing step becomes difficult, and that the substrate 12 is warped because of an internal stress of a membrane formed on the substrate 12. In addition, when the substrate 12 has a thickness of not more than 800 μm, it can be inhibited that a period of time required for a step of forming the holes 20 in the substrate 12 is elongated to increase a manufacturing cost of the through electrode substrate 10.

(Hole)

The holes 20 are provided in the substrate 12 so as to extend from the first surface 13 of the substrate 12 to reach the second surface 14 thereof. In other words, the holes 20 pass through the substrate 12. A diameter of the hole 20 is within a range between not less than 20 μm and not more than 150 μm, for example. In addition, an interval between the adjacent two holes 20, i.e., an arrangement pitch of the holes 20 is, for example, within a range between not less than 50 μm and not more than 300 μm.

(Hole Electrode Part)

The hole electrode part 22 is an electroconductive member that is provided inside the hole 20. For example, as shown in FIG. 2A, the hole electrode part 22 is an electroconductive layer extending from the first surface 13 side to reach the second surface 14 side along a sidewall 21 of the hole 20. In the below-described first hole 20A of the plurality of holes 20, the hole electrode part 22 electrically connects, via the hole 20, the first electrode part 31 provided on the first surface 13 side of the substrate 12 and the second electrode part 36 provided on the second surface 14 side of the substrate 12.

Figure 2B:
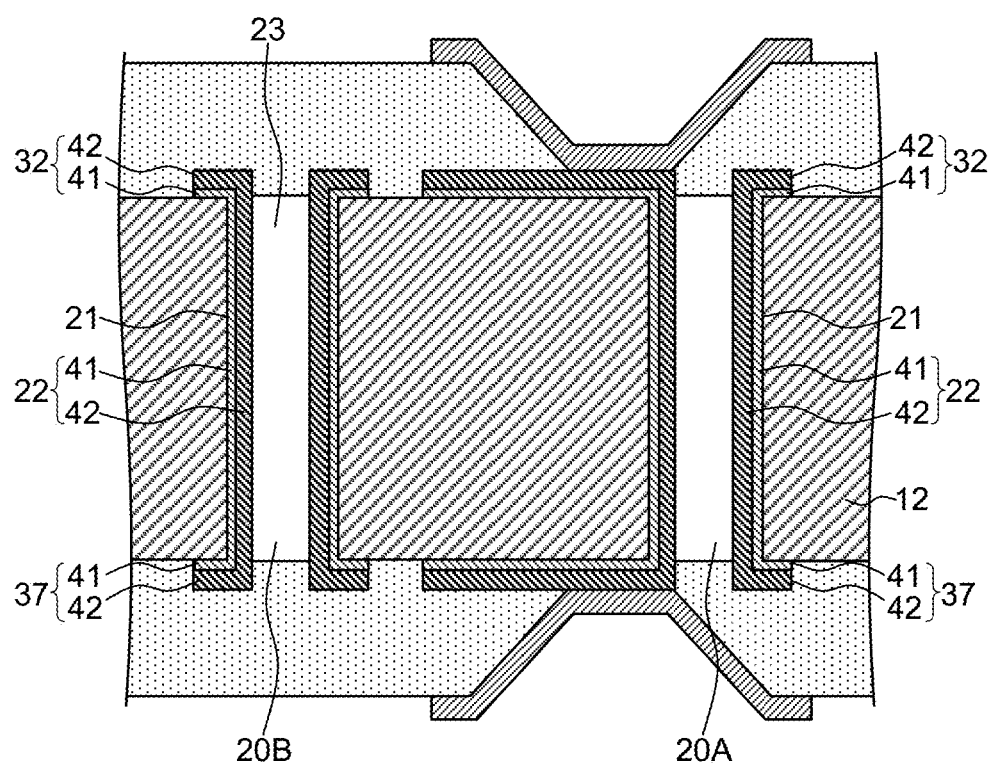
FIG. 2B is a sectional view of a hole electrode part of the through electrode substrate of FIG. 2A in enlargement.

An example of the structure of the hole electrode part 22 is described with reference to FIG. 2B. FIG. 2B is a sectional view of the hole electrode part 22 in enlargement. The hole electrode part 22 includes an electroconductive layer provided on the sidewall 21 of the hole 20. As long as the electroconductive layer has an electroconductive property, a method of forming the electroconductive layer is not particularly limited. For example, the electroconductive layer may be formed by a physical film deposition method such as a vapor deposition method or a sputtering method, or may be formed by a chemical film deposition method or a plating method. In addition, the electroconductive layer may be composed of a single layer, or may include a plurality of layers. In this embodiment, an example in which the electroconductive layer of the hole electrode part 22 includes a seed layer 41 and a plating layer 42 provided on the seed layer 41 is described.

The seed layer 41 is a layer having an electroconductive property, which serves as a base on which metal ions in a plating solution deposit to grow the plating layer 42, during a plating step of forming the plating layer 42. Preferably, an electroconductive material having a high adhesion property to the material of the substrate 12 is used as a material of the seed layer 41. For example, as the material of the seed layer 41, titanium, molybdenum, tungsten, tantalum, nickel, chrome, aluminum, a compound of them, an alloy of them, or lamination of them may be used.

When the plating layer 42 deposited on the seed layer 41 contains copper, a material that inhibits the copper from diffusing inside the substrate 12 is preferably used as the material of the seed layer 41. For example, titanium nitride, molybdenum nitride, tantalum nitride or lamination of them may be used. A thickness of the seed layer 41 is within a range between not less than 20 nm and not more than 500 nm, for example.

The plating layer 42 is a layer having an electroconductive property, which is provided on the seed layer 41 in order to increase an electroconductive property of the hole electrode part 22. As a material of the plating layer 42, an electroconductive material having a high adhesion property to the seed layer 41 and a high electroconductive property is preferably used. For example, metal such as copper, gold, silver, platinum, rhodium, tin, aluminum, nickel and chrome, alloy of them, or lamination of them may be used as the material of the plating layer 42. A thickness of the plating layer 42 is within a range between not less than 1 μm and not more than 10 μm, for example.

The thickness of the plating layer 42 is determined in accordance with the electroconductive property required for the hole electrode part 22. For example, when the hole electrode part 22 is a member for conduction of a power supply line or a ground line, the plating layer 42 having a sufficient thickness is used. In addition, when the hole electrode part 22 is a member for conduction of a weak electric signal, the plating layer 42 having a small thickness may be used. Alternatively, although not shown, only the seed layer 41 may be provided on the hole 20 without providing the plating layer 42.

As shown in FIG. 2A and FIG. 2B, the plating layer 42 of the hole electrode part 22 may be provided on the seed layer 41 such that a hollow part 23 is formed inside the hole 20. The hollow part 23 is an area inside the hole 20 where any sold bodies such as the seed layer 41 and the plating layer 42 do not exist.

As described below, the whole inside area of the hole 20 may be filled with the hole electrode part 22.

(Electrode Part)

The first electrode part 31 and the second electrode part 36 are respectively portions of the through electrode substrate 10, which are connected to terminals of an element or a printed circuit board to which the through electrode substrate 10 is attached. The first electrode part 31 and the second electrode part 36 are referred to as pads or lands. The first electrode part 31 is exposed to the surface of the through electrode substrate 10 on the first surface 13 side of the substrate 12. In addition, the second electrode part 36 is exposed to the surface of the through electrode substrate 10 on the second surface 14 side of the substrate 12. An electroconductive material, such as metal, is used as a material of the electrode part 31, 36. For example, the electrode part 31, 36 includes a gold plating layer formed by supplying a plating solution containing gold to the substrate 12.

(Wiring)

The first wiring 32 is an electroconductive layer provided on the first surface 13 side of the substrate 12 so as to electrically connect the hole electrode part 22 and the first electrode part 31. Similarly, the second wiring 37 is an electroconductive layer provided on the second surface 14 side of the substrate 12 so as to electrically connect the hole electrode part 22 and the second electrode part 36. An electroconductive material, such as metal, is used as a material of the wiring 32, 37.

The wiring 32, 37 may have the same layer structure as that of the hole electrode part 22. For example, as shown in FIG. 2B, when the hole electrode part 22 includes the seed layer 41 and the plating layer 42, the wiring 32, 37 may also include the seed layer 41 and the plating layer 42. In addition, although not shown, the wiring 32, 37 may include an electroconductive layer of different structure from that of the hole electrode part 22.

(Insulation Layer)

The first insulation layer 33 is a layer having an insulation property, which is provided on the first surface 13, in order to cover an area of the first surface 13 of the substrate 12 to which an electrical access from outside is not necessary. For example, as shown in FIG. 2A, the first insulation layer 33 at least covers a hole 20 of a plurality of the holes 20, where the hole electrode part 22 is not electrically connected to the first electrode part 31. In addition, the second insulation layer 38 is a layer having an insulation property, which is provided on the second surface 14, in order to cover an area of the second surface 14 of the substrate 12 to which an electrical access from outside is not necessary. For example, as shown in FIG. 2A, the second insulation layer 38 at least covers a hole 20 of a plurality of the holes 20, where the hole electrode part 22 is not electrically connected to the second electrode part 36. A material having an insulation property, such as a resin material such as epoxy resin, an inorganic material such as silicon oxide, or a photosensitive negative type dry film resist, is used as a material of the insulation layer 33, 38.

As shown in FIG. 2A, the first insulation layer 33 is provided with an aperture for exposing the first wiring 32 or the hole electrode part 22 from the first insulation layer 33. The aforementioned first electrode part 31 is provided in the aperture of the first insulation layer 33 so as to connect to the first wiring 32 or the hole electrode part 22. Similarly, the second insulation layer 38 is provided with an aperture for exposing the wiring 37 or the hole electrode part 22 from the second insulation layer 38. The aforementioned second electrode part 36 is provided on the aperture of the second insulation layer 38 so as to connect to the second wiring 37 or the hole electrode part 22.

As shown in FIG. 1 and FIG. 2A, some holes of a plurality of the holes 20 are electrically connected to the electrode parts 31, 36, and other holes of a plurality of the holes 20 are not electrically connected to the electrode parts 31, 36. In this embodiment, among a plurality of the holes 20, a hole 20, in which a hole electrode part 22 provided thereon is electrically connected to the first electrode part 31 on the first surface 13 side of the substrate 12, and the hole electrode part 22 provided thereon is electrically connected to the second electrode part 36 on the second surface 14 side of the substrate 12, is referred to as first hole 20A. The hole electrode part 22 provided on the first hole 20A functions as a through electrode for electrically connecting the first electrode part 31 and the second electrode part 36. In addition, among a plurality of the holes 20, a hole 20, in which a hole electrode part 22 provided thereon is electrically insulated from the first electrode part 31 on the first surface 13 side of the substrate 12, and the hole electrode part 22 provided thereon is electrically insulated from the second electrode part 36 on the second surface 14 side of the substrate 12, is referred to as second hole 20B.

In this embodiment, the hole electrode part 22 provided on the second hole 20B is insulated from the first electrode part 31, because the first insulation layer 33 covers the second hole 20B on the first surface 13 side. In addition, the hole electrode part 22 provided on the second hole 20B is insulated from the second electrode part 36, because the second insulation layer 38 covers the second hole 20B on the second surface 14 side. A method of electrically insulating the hole electrode part 22 of the second hole 20B from the electrode parts 31, 36 is not limited to the above method. For example, although not shown, by providing a gap between the hole electrode part 22 and the electrode part 31, 36, the hole electrode part 22 may be electrically insulated from the electrode part 31, 36.

In this embodiment, a plurality of the first holes 20A are arranged to align along an outer periphery of the substrate 12. On the other hand, a plurality of the second holes 20B is arranged on an area inside the area on which the first holes 20A are arranged. As shown in FIG. 1, the holes 20 including the first holes 20A and the second holes 20B are arranged such that, in a plan view, the holes 20 align along a direction in which the outer periphery of the substrate 12 extends.

Herebelow, an advantage of providing two types of the first holes 20A and the second holes 20B in the substrate 12 is described.

The aforementioned first hole 20A is a hole provided in the substrate 12 for transmitting power and electric signals between the first surface 13 side and the second surface 14 side of the substrate 12. In a conventional through electrode substrate, the first holes 20A are provided in the substrate 12 in accordance with terminals of an element such as an LSI chip. In this case, when a layout of the terminals of the element is uneven, a layout of the first holes 20A in the substrate 12 becomes uneven. For example, a distribution density of the first holes 20A in the substrate 12 becomes non-uniform. As a result, the substrate 12 may have a defect such as warpage and/or distortion. Thus, in a manufacturing step of the through electrode substrate 10 after the first holes 20A have been formed in the substrate 12 and/or a manufacturing step of a product using the through electrode substrate 10, the substrate 12 may be inappropriately transferred and/or the handling of the substrate 12 may become difficult.

On the other hand, according to this embodiment, the through electrode substrate 10 further comprises the second holes 20B in addition to the aforementioned first holes 20A. Since the hole electrode parts 22 provided in the second holes 20B are covered with the first insulation layer 33 and the second insulation layer 38, the second holes 20B do not contribute to the transmission of power and electric signals between the first surface 13 side and the second surface 14 side. Namely, the second holes 20B are not holes that fulfill an electric function. Due to the provision of such second holes 20B in the substrate 12, the distribution density of the holes 20 in the substrate 12 can be made more uniform, irrespective of the layout of the first holes 20A. Thus, it can be inhibited that the rigidity and the deformability of the substrate 12 vary from place to place. Therefore, in a manufacturing step of the through electrode substrate 10 and a manufacturing step of a product using the through electrode substrate 10, the substrate 12 can be inhibited from warping and/or distorting.

Preferably, a plurality of the holes 20 are formed in the substrate 12 such that the distribution density of the holes 20 in the first surface 13 and the second surface 14 of the substrate 12 becomes uniform irrespective of place. For example, when the substrate 12 is virtually divided equally into sections the number of which is N in a plane direction, the number of holes 20 formed in the N sections is within a range of an average value±20%. Herein, N is a suitable integer of e.g., 16. Preferably, a plurality of the holes 20 respectively has the same volume.

Manufacturing Method of Through Electrode Substrate

Herebelow, an example of the manufacturing method of the through electrode substrate 10 is described with reference to FIG. 3A through 3G.

Firstly, a design step of designing positioning of a plurality of the holes 20 is performed. For example, the substrate 12 is virtually placed on a computer. Then, a positioning step of determining positioning of the holes 20 in the substrate 12 is performed on the computer.

In the positioning step, a first positioning step of determining positioning of the first holes 20A to be electrically connected to terminals of an element mounted on the through electrode substrate 10 is firstly performed. Then, a second positioning step of determining positioning of the second holes 20B not to be electrically connected to the terminals of the element is performed. The second positioning step determines the positioning of the second holes 20B such that the second holes 20B are not overlapped with the first holes 20A, and that the distribution density of the holes 20 including the first holes 20A and the second holes 20B is uniform in the plane direction of the substrate 12.

Figure 3A:
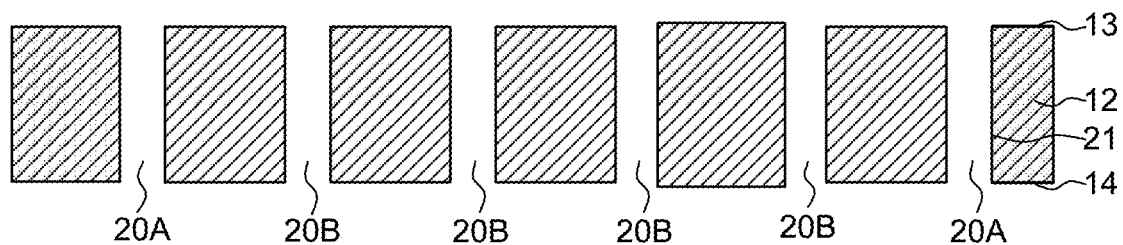
FIG. 3A is a view showing a step of forming holes in a substrate.

Thereafter, the substrate 12 is prepared. Then, as shown in FIG. 3A, a hole forming step of forming the holes 20A and 20B by processing the substrate 12 is performed, based on the positioning determined in the positioning step. For example, although not shown, an area of the surface 13, 14 of the substrate 12, in which the holes 20A, 20B are not formed, is covered with a resist layer. Then, an area of the surface 13, 14 of the substrate 12, which is not covered with the resist layer, is removed so as to form the holes 20A, 20B. A dry etching method, such as a reactive ion etching method or a deep reactive ion etching method, and a wet etching method may be used as a method of removing an area that is not covered with the resist layer.

As an etching solution for the wet etching method, one of hydrogen fluoride (HF), sulfuric acid ($H_2SO_4$), nitric acid ($HNO_3$) and hydrochloric acid (HCl), or mixture thereof may be used.

As the dry etching method, a dry etching RIE (Reactive Ion Etching) method using plasma, a DRIE (Deep Reactive Ion Etching RIE) method using a Bosch process, a sand blasting method, and a laser machining such as laser ablation may be used.

As a laser for the laser machining, an excimer laser, an Nd:YAG laser, a femtosecond laser and so on may be used. When an Nd:YAG laser is used, a fundamental wave having a wavelength of 1064 nm, a second radiofrequency having a wavelength of 532 nm, and a third radiofrequency having a wavelength of 355 nm and so on may be used.

In addition, laser radiation and wet etching may suitably be combined. To be specific, an altered layer is formed by laser radiation on an area of the substrate 12, in which the holes 20A and 20B should be formed. Then, the substrate 12 is immersed in hydrogen fluoride to etch the altered layer. Thus, the holes 20A and 20B can be formed in the substrate.

Figure 3B:
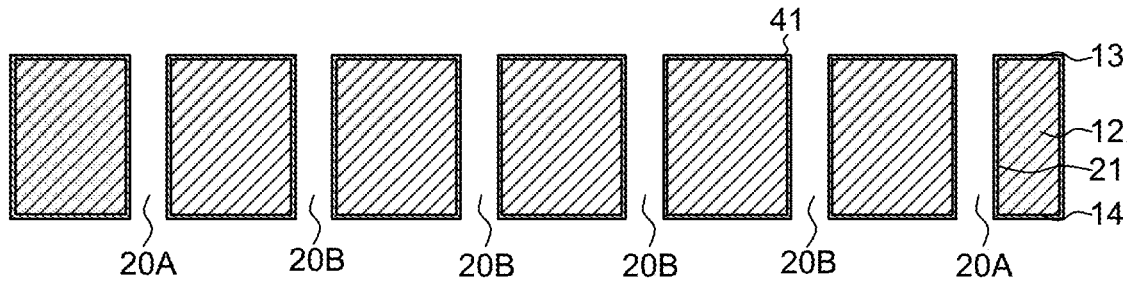
FIG. 3B is a view showing a step of forming a seed layer on a first surface and a second surface of the substrate, and on a sidewall of the hole.

Then, a hole-electrode-part forming step of forming the hole electrode parts 22 inside the holes 20A and 20B of the substrate 12 is performed. For example, as shown in FIG. 3B, the seed layer 41 is firstly formed on the first surface 13 and the second surface 14 of the substrate 12, as well as on the sidewalls 21 of the holes 20A and 20B. As a method of forming the seed layer 41, a physical film deposition method such as a vapor deposition method or a sputtering method, or a chemical film deposition method may be used.

Figure 3C:
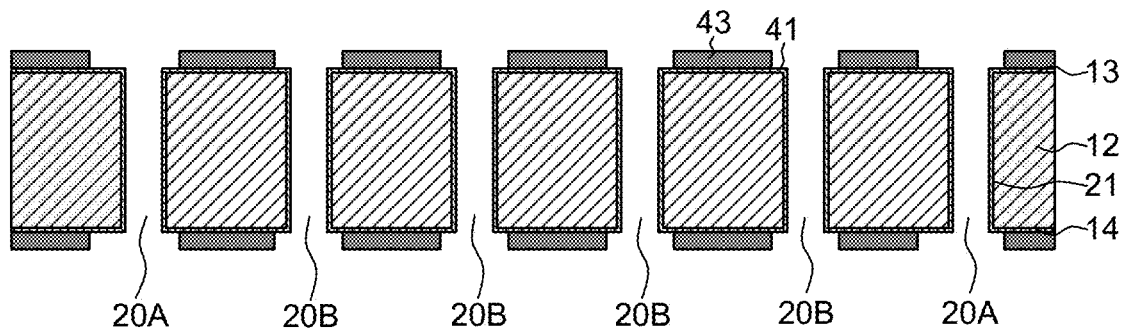
FIG. 3C is a view showing a step of partially forming a resist layer on the first surface and the second surface of the substrate.

Then, as shown in FIG. 3C, a resist-layer forming step of partially forming a resist layer 43 on the first surface 13 and the second surface 114 of the substrate 12 is performed. The resist-layer forming step forms the resist layer 43 such that the resist layer 43 covers areas of the first surface 13 and the second surface 14 of the substrate 12, on which the first wiring 32 and the second wiring 37 are not provided.

Figure 3D:
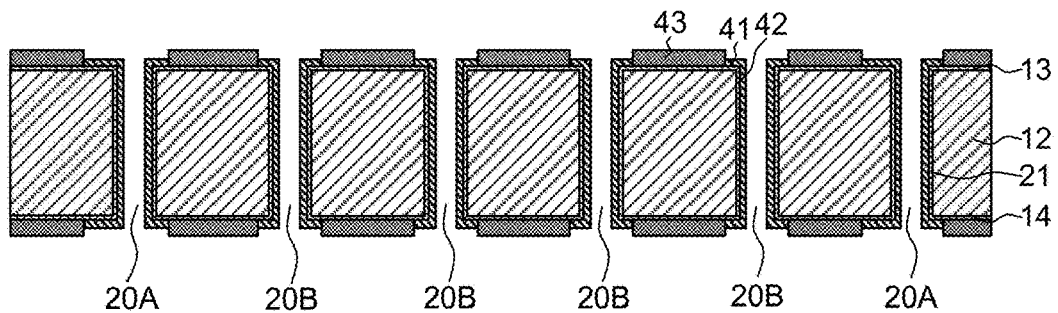
FIG. 3D is a view showing a step of forming a plating layer on the seed layer.
Figure 3E:
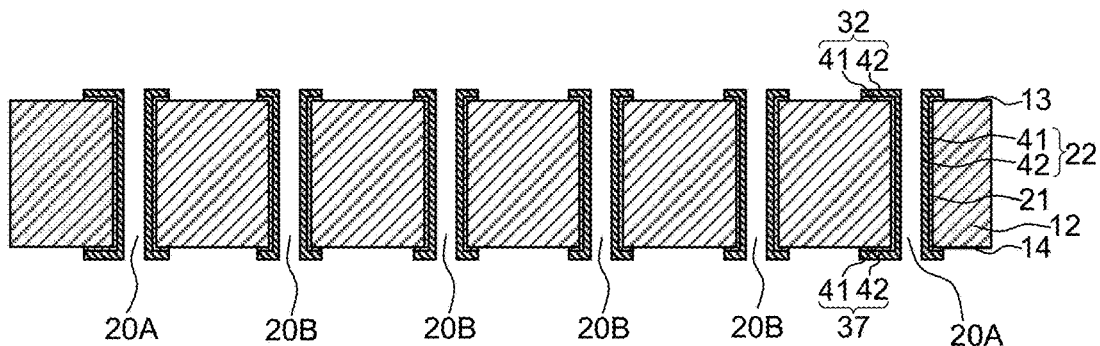
FIG. 3E is a view showing a step of partially removing the resist layer and the seed layer.

Then, as shown in FIG. 3D, a plating step of forming the plating layer 42 on the seed layer 41 by supplying a plating solution to the substrate 12 is performed. Then, as shown in FIG. 3E, the resist layer 43 and the seed layer 41 covered with the resist layer 43 are removed. In this manner, the hold electrode part 22 including the seed layer 41 and the plating layer 42 is formed inside the hole 20A, 20B.

At this time, as shown in FIG. 3E, the first wiring 32, which includes the seed layer 41 and the plating layer 42 and is provided on the first surface 13 side of the substrate 12, and the second wiring 37, which includes the seed layer 41 and the plating layer 42 and is provided on the second surface 14 side of the substrate 12, are obtained simultaneously with the hole electrode part 22.

Figure 3F:
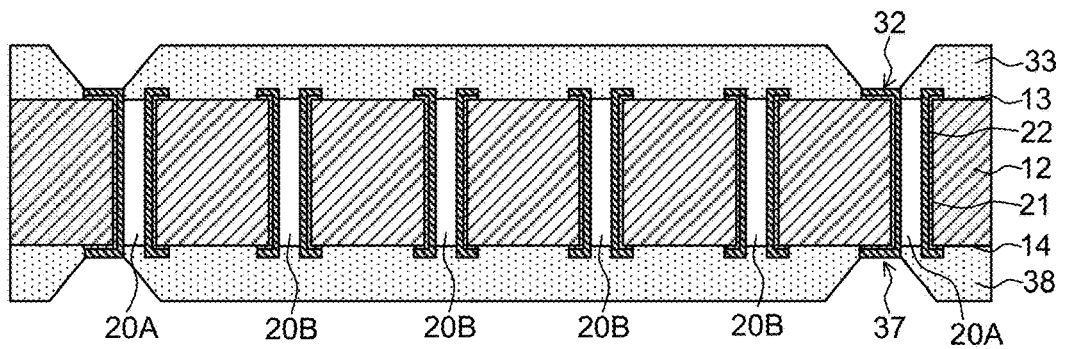
FIG. 3F is a view showing a step of forming an insulation layer on the first surface and the second surface of the substrate.

Then, as shown in FIG. 3F, an insulation-layer forming step of forming the first insulation layer 33 on the first surface 13 of the substrate 12, and forming the second insulation layer 38 on the second surface 14 of the substrate 12 is performed. The first insulation layer 33 is formed such that it exposes the hole electrode part 22 provided on the first hole 20A or the first wiring 32 connected to the hole electrode part 22 to the outside, and that it covers the hole electrode part 22 provided on the second hole 20B or the first wiring 32 connected to the hole electrode part 22. Similarly, the second insulation layer 38 is formed such that it exposes the hole electrode part 22 provided on the first hole 20A or the second wiring 37 connected to the hole electrode part 22 to the outside, and that it covers the hole electrode part 22 provided on the second hole 20B or the second wiring 37 connected to the hole electrode part 22.

In the insulation-layer forming step, for example, a film, which has a support layer and an insulation layer containing an insulation material and provided on the support layer, is firstly attached to the first surface 13 and the second surface 14 of the substrate 12 respectively. Then, the support layer of the film attached to the substrate 12 is removed from the insulation layer. Then, an aperture part for exposing the wiring 32, 37 connected to the hole electrode part 22 of the first hole 20A to the outside is formed in the insulation layer. In this manner, the insulation layers 33 and 38 shown in FIG. 3F can be obtained.

Although not shown, in the insulation-layer forming step, a solution containing an insulation material may be applied onto the substrate 12, and the solution may be thereafter solidified so as to form the insulation layer 33, 38.

Figure 3G:
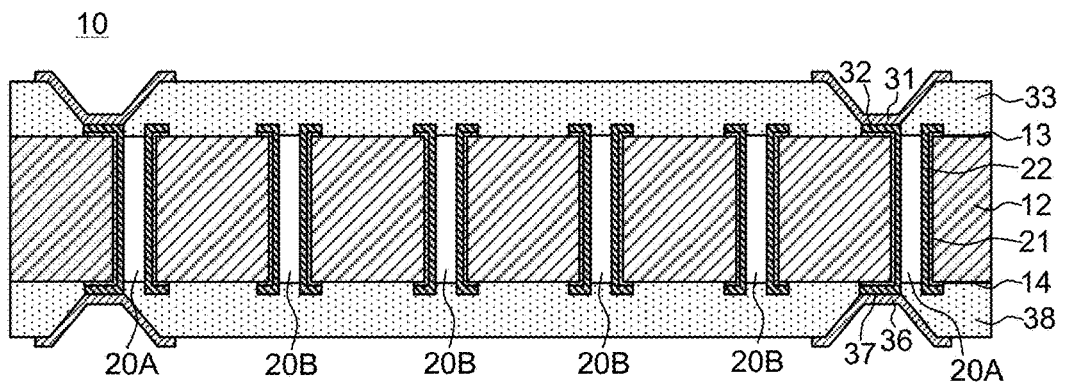
FIG. 3G is a view showing a step of forming an electrode part on the first surface and the second surface of the substrate.

Then, as shown in FIG. 3G, an electrode-part forming step of forming the electrode 31, 36 on the aperture part of the insulation layer 33, 38 is performed. For example, a metal layer is firstly formed by a plating method or a sputtering method. Then, by patterning the metal layer by an etching method, the electrode part 31, 36 is formed on the aperture part of the insulation layer 33, 38. In this manner, it is possible to obtain the through electrode substrate 10 which includes a plurality of the first holes 20A that are provided with the hole electrode parts 22 electrically connected to the electrode parts 31 and 36, and a plurality of the second holes 20B that are provided with the hole electrode parts 22 electrically insulated from the electrode parts 31 and 36.

According to this embodiment, by forming the first holes 20A and the second holes 20B in the substrate 12, the distribution density of the holes 20A and 20B in the substrate can be made more uniform. Thus, even when a temperature and flow of the plating solution are varied or disturbed around the holes 20A and 20B upon the plating step, the variation and the disturbance can be uniformly generated at every place of the substrate 12 in the plane direction. Thus, it is possible to inhibit that the thickness of the plating layer 42 varies from place to place, and that the plating layer 42 has irregularities. As a result, it is possible to inhibit the substrate 12 from having warpage and/or distortion, which might be caused by the non-uniform thickness of the plating layer 42.

First Modification Example

Figure 4A:
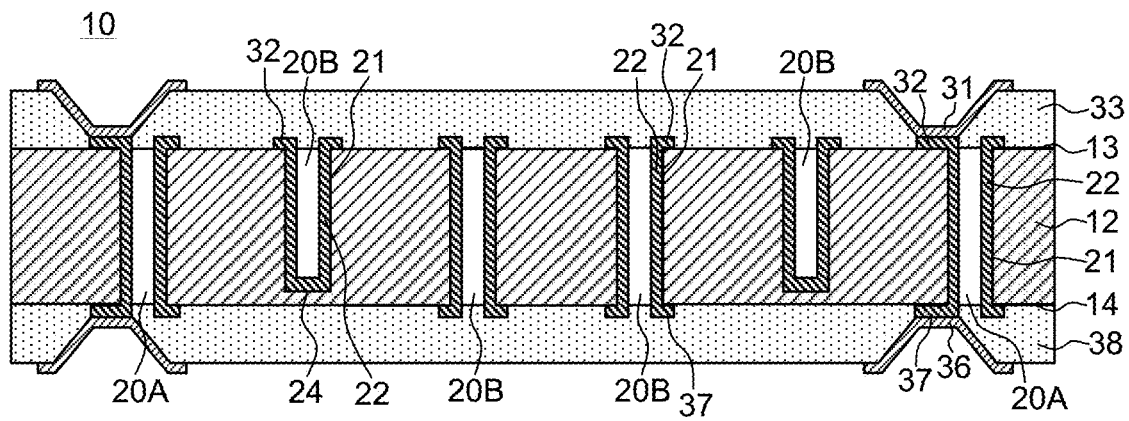
FIG. 4A is a sectional view showing a through electrode substrate according to a first modification example of the first embodiment.
Figure 4B:
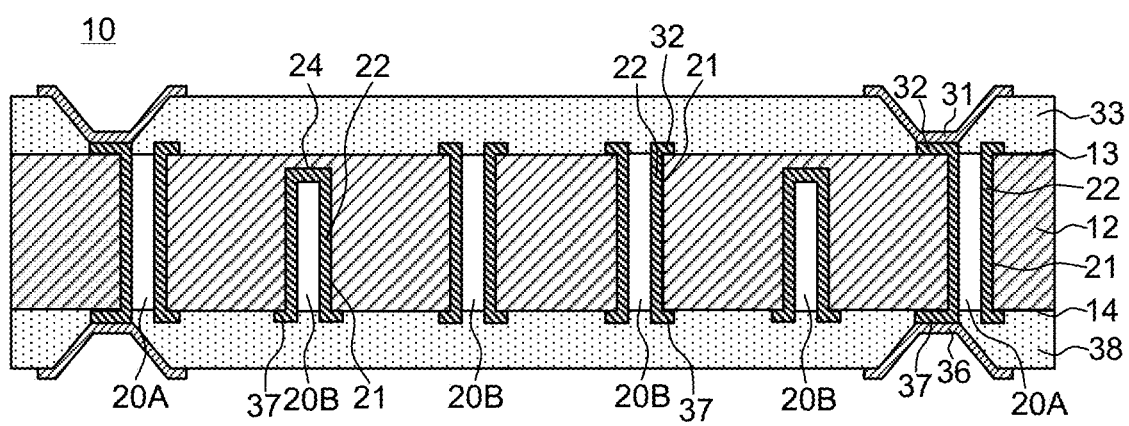
FIG. 4B is a sectional view showing the through electrode substrate according to the first modification example of the first embodiment.

The above embodiment shows the example in which both the first hole 20A and the second hole 20B are through holes which pass through the substrate 12 from the first surface 13 side to the second surface 14 side. However, not limited thereto, the second hole 20B may be a non-through hole that does not pass through the substrate 12. For example, as shown in FIG. 4A, the second hole 20B may be a non-through hole that is formed not to reach the second surface 14 of the substrate 12. Alternatively, as shown in FIG. 4B, the second hole 20B may be a non-through hole that is formed not to reach the first surface 13 of the substrate 12. When the first hole 20B is a non-through hole, the second hole 20B includes a sidewall 21 and a bottom 24. The hole electrode part 22 is provided on the sidewall 21 and on the bottom 24.

Even when the second holes 20B are non-through holes, the distribution density of the holes 20A, 20B can be made more uniform by providing the second holes 20B in the substrate 12, in addition to the first holes 20A. Thus, it is possible to inhibit that the rigidity and the deformability of the substrate 12 vary from place to place. As a result, in a manufacturing step of the through electrode substrate 10 and/or a manufacturing step of a product using the through electrode substrate 10, the substrate 12 can be inhibited from warping and/or distorting.

Second Modification Example

The above embodiment shows the example in which the the wiring 32, 37 having the same layer structure as that of the hole electrode part 22 is simultaneously formed with the hole electrode part 22. However, not limited thereto, the wiring 32, 37 having a structure different from that of the hole electrode part 22 may be formed at a different timing from that of the hole electrode part 22. Herebelow, a manufacturing method of the through electrode substrate 10 in this modification example is described with reference to FIG. 5A through 5D.

Figure 5A:
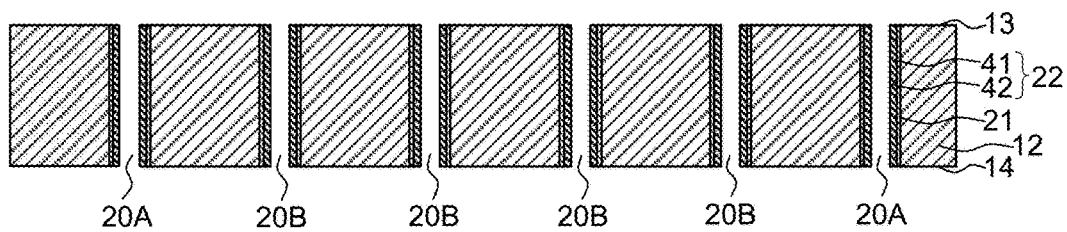
FIG. 5A is a view showing a step of forming a hole electrode part inside a hole, in a second modification example of the first embodiment.

Firstly, similarly to the above embodiment, the seed layer 41 and the plating layer 42 are formed on the holes 20A and 20B of the substrate 12 to obtain the aforementioned intermediate product shown in FIG. 3E. Then, as shown in FIG. 5A, a portion of the seed layer 41 and the plating layer 42, which is present on the first surface 13 and the second surface 14 of the substrate 12, is removed. For example, a chemical mechanical grinding method may be used as a method of removing the seed layer 41 and the plating layer 42 on the first surface 13 and the second surface 14.

Figure 5B:
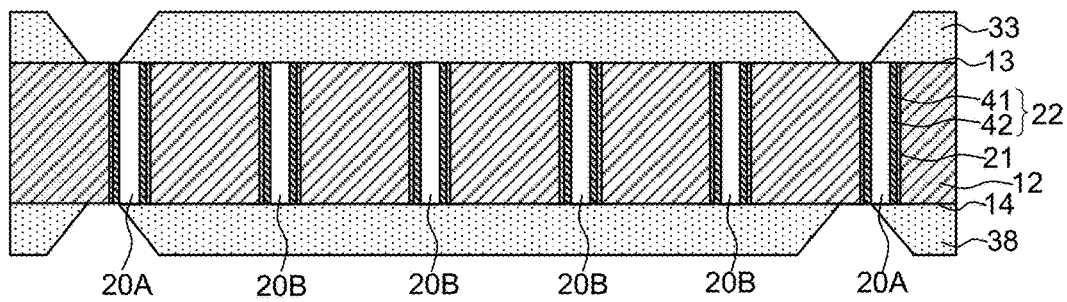
FIG. 5B is a view showing a step of forming an insulation layer on a first surface and a second surface of a substrate, in the second modification example of the first embodiment.

Then, as shown in FIG. 5B, the insulation-layer forming step of forming the first insulation layer 33 on the first surface 13 of the substrate 12, and forming the second insulation layer 38 on the second surface 14 of the substrate 12 is performed. The first insulation layer 33 is formed such that it exposes the hole electrode part 22 provided on the first hole 20A to the outside, and that it covers the hole electrode part 22 provided on the second hole 20B. Similarly, the second insulation layer 38 is formed such that it exposes the hole electrode part 22 provide on the first hole 20A to the outside, and that it covers the hole electrode part 22 provided on the second hole 20B.

Figure 5C:
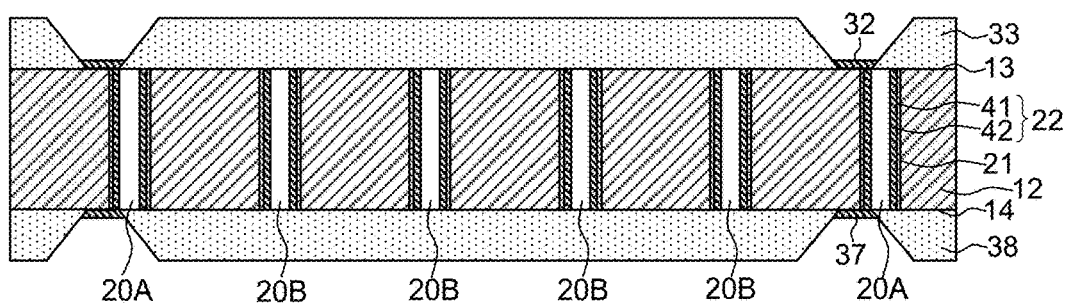
FIG. 5C is a view showing a step of forming a wiring on the first surface and the second surface of the substrate, in the second modification example of the first embodiment.

Then, as shown in FIG. 5C, the wiring forming step of forming the first wiring 32 on the first surface 13 of the substrate 12, and forming the second wiring 37 on the second surface 14 of the substrate 12 is performed. For example, the wiring 32, 37 connected to the first electrode part 22 of the first hole 20A is formed in the aperture part of the insulation layer 33, 38. At this time, although not shown, a wiring 32, 37 not connected to he hole electrode part 22 of the first hole 20A may be formed. In this case, the insulation layer 33, 38 is provided with an aperture part for forming the wiring 32, 37, at a position not corresponding to the first hole 20A.

Figure 5D:
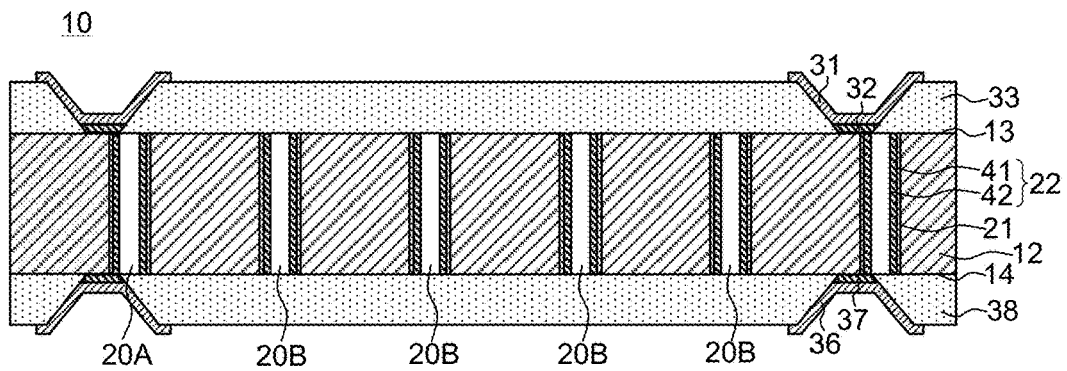
FIG. 5D is a view showing a step of forming an electrode part on the first surface and the second surface of the substrate, in the second modification example of the first embodiment.

Then, as shown in FIG. 5D, the electrode-part forming step of forming the electrode part 31, 36 connected to the wiring 32, 37 is performed. In this manner, it is possible to obtain the through electrode substrate 10 which includes a plurality of the first holes 20A provided with the hole electrode parts 22 electrically connected to the electrode parts 31 and 36, and a plurality of the second holes 20B provided with the hole electrode parts 22 electrically insulated from the electrode parts 31 and 36.

In this modification example, as described above, the step in which the portion of the seed layer 41 and the plating layer 42, which is present on the first surface 13 and the second surface 14 of the substrate, is removed by the chemical mechanical grinding method is performed. In the chemical mechanical grinding method, a pressure is applied to a portion to be removed. At this time, when the thickness of a portion to which a pressure is applied, herein, the plating layer 42 varies from place to place and/or the plating layer 42 has irregularities, a pressure applied to the plating layer 42 varies from place to place. As a result, the plating layer 42 and the seed layer 41 are non-uniformly removed. For example, the plating layer 42 and the seed layer 41 may not be sufficiently removed depending on a place to generate a residue of the electroconductive material.

In this modification example, by forming the first holes 20A and the second holes 20B in the substrate 12, it is inhibited that the thickness of the plating layer 42 varies from place to place and/or that the plating layer 42 has irregularities. Thus, when the chemical mechanical grinding method is performed, it is possible to inhibit that the pressure applied to the first surface 13 and the second surface 14 of the substrate 12 varies from place to place. As a result, generation of residue of the electroconductive material can be inhibited.

Third Modification Example

The above second modification example shows the example in which the wirings 32 and 37 are formed after the insulation layers 33 and 38 have been formed. However, not limited thereto, the insulation layers 33 and 38 may be formed after the wirings 32 and 37 have been formed. Herebelow, a manufacturing method of the through electrode substrate 10 in this modification example is described with reference to FIG. 6A through 6C.

Figure 6A:
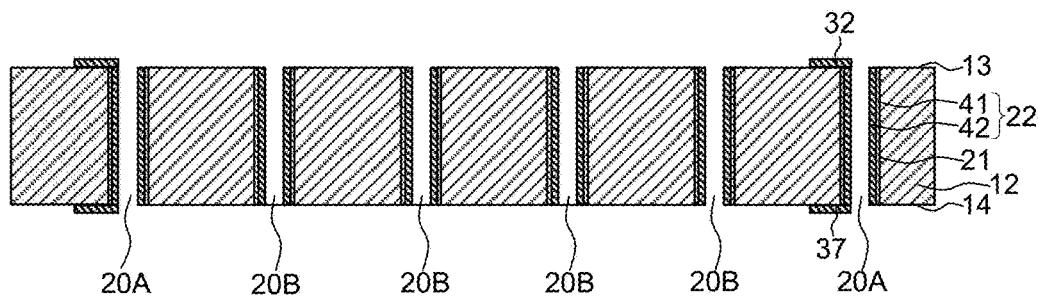
FIG. 6A is a view showing a step of forming a wiring on a first surface and a second surface of a substrate, in a third modification example of the first embodiment.

Firstly, similarly to the above second modification example, the intermediate product shown in FIG. 5A is obtained. Then, as shown in FIG. 6A, the wiring forming step of forming the first wiring 32 on the first surface 13 of the substrate 12, and forming the second wiring 37 on the second surface 14 of the substrate 12 is performed. For example, the wirings 32 and 37 connected to the hole electrode parts 22 of the first holes 20A are formed on the first surface 13 and the second surface 14. At this time, although not shown, a wiring 32, 37 not to be connected to the hole electrode part 22 of the first hole 20A may be formed.

Figure 6B:
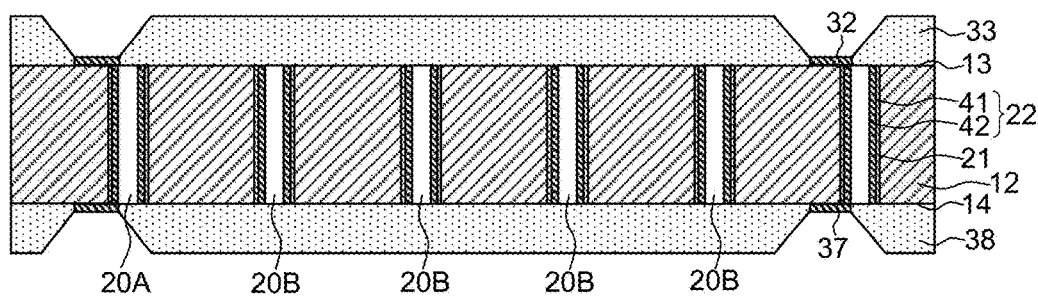
FIG. 6B is a view showing a step of forming an insulation layer on the first surface and the second surface of the substrate, in the third modification example of the first embodiment.

Then, as shown in FIG. 6B, the insulation-layer step of forming the first insulation layer 33 on the first surface 13 of the substrate 12, and forming the second insulation layer 38 on the second surface 14 of the substrate 12 is performed. The first insulation layer 33 is formed such that it exposes the first wiring 32 connected to the hole electrode part 22 provided on the first hole 20A to the outside, and that it covers the first wiring 32 connected to the hole electrode part 22 provided on the second hole 20B. Similarly, the second insulation layer 38 is formed such that it exposes the second wiring 37 connected go the hole electrode part 22 provided on the first hole 20A, and that it covers the second wiring 37 connected to the hole electrode part 22 provided on the second hole 20B.

Figure 6C:
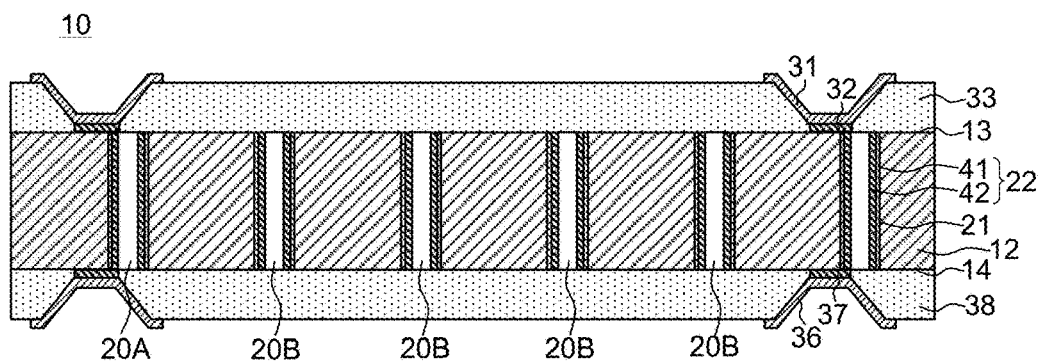
FIG. 6C is a view showing a step of forming an electrode part on the first surface and the second surface of the substrate, in the third modification example of the first embodiment.

Then, as shown in FIG. 6C, the electrode-part forming step of forming the electrode part 31, 36 in the aperture part of the insulation layer 33, 38 is performed. In this manner, it is possible to obtain the through electrode substrate 10 which includes a plurality of the first holes 20A provided with the hole electrode parts 22 electrically connected to the electrode parts 31 and 36, and a plurality of the second holes 20B provided with the hole electrode parts 22 electrically insulated from the electrode parts 31 and 36.

Also in this modification example, by forming the first holes 20A and the second holes 20B in the substrate 12, it is inhibited that the thickness of the plating layer 42 varies from place to place and/or that the plating layer 42 has irregularities. Thus, when the chemical mechanical grinding method is performed, it is possible to inhibit that the pressure applied to the first surface 13 and the second surface 14 of the substrate 12 varies from place to place. As a result, generation of residue of the electroconductive material can be inhibited.

Second Embodiment

Figure 8A:
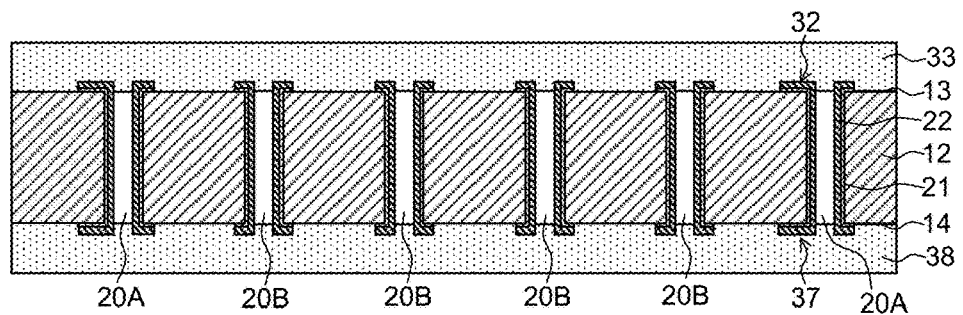
FIG. 8A is a view showing an insulation layer on a first surface and a second surface of the substrate.
Figure 8B:
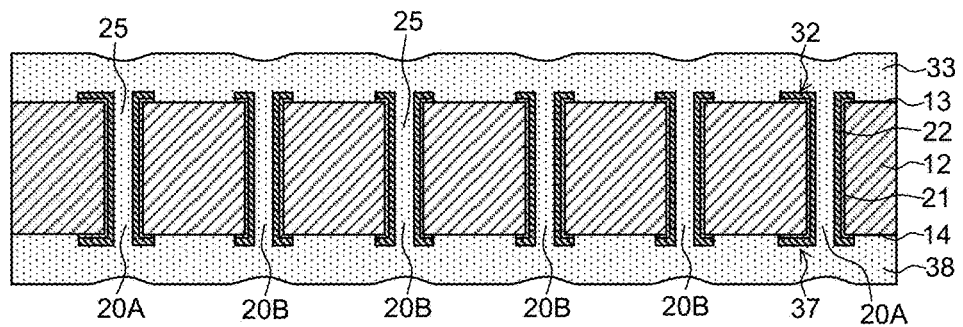
FIG. 8B is a view showing a step of providing a filling member inside a hole.
Figure 9:
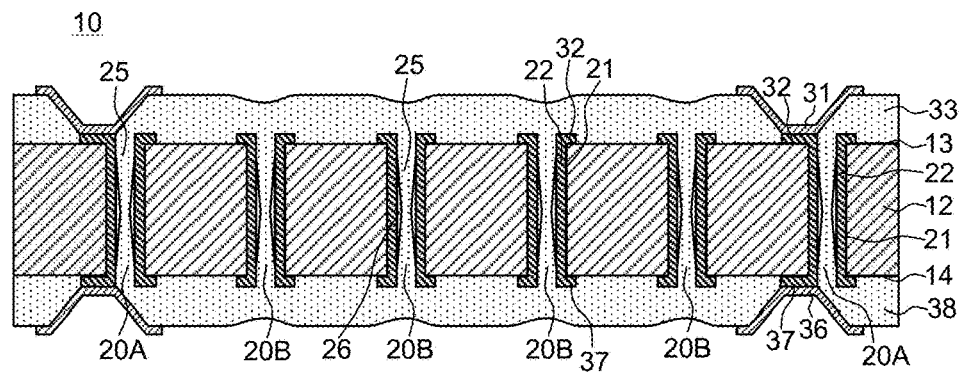
FIG. 9 is a sectional view showing a through electrode substrate according to a first modification example of the second embodiment.

Next, a second embodiment is described with reference to FIG. 7 through FIG. 9. The second embodiment differs from the first embodiment only in that the hole 20A, 20B is filled with a filling member 25, and is substantially the same in other structure. In the second embodiment, the same part as that of the first embodiment is shown by the same reference number, and detailed description thereof is omitted. In addition, when the effect obtained in the first embodiment is apparently obtained also in the second embodiment, description thereof may be omitted.

Figure 7:
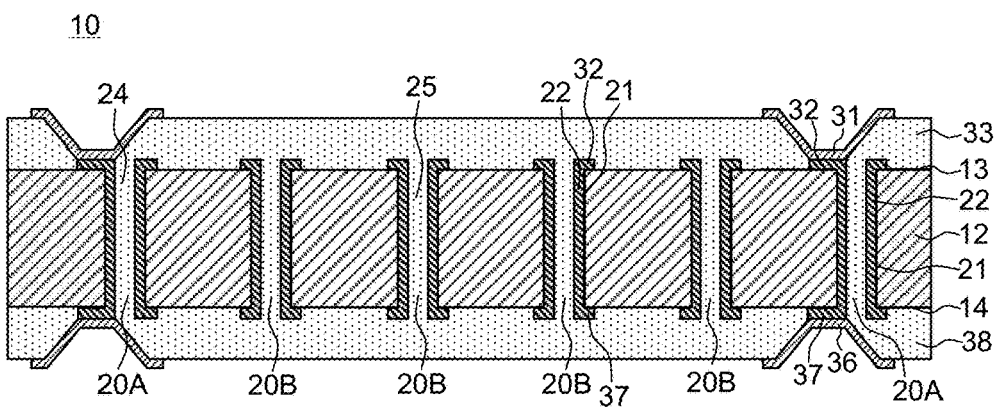
FIG. 7 is a sectional view showing a through electrode substrate according to a second embodiment.

FIG. 7 is a sectional view showing the though electrode substrate 10 according to this embodiment. The through electrode substrate 10 further comprises the filling member 25 provided inside the hole 20A, 20B, which is nearer to a center side of the hole 20A, 20B than the hole electrode part 22. The fact that the filling member 25 is "located nearer to the center side" means that, inside the hole 20A, 20B, a distance between the filling member 25 and the sidewall 21 is larger than a distance between the hole electrode part 22 and the sidewall 21. The filling member 25 contains, for example, an insulation resin material such as polyimide or benzocyclobutene, or an inorganic material such as silicon oxide or silicon nitride.

Herebelow, an advantage of providing the filling member 25 in the hole 20A, 20B is described.

In a manufacturing step of the through electrode substrate 10, after the formation of the holes 20A and 20B and the hole electrode parts 22, a step of forming the electrode parts 31 and 36 by supplying a plating solution containing gold to the substrate 12 is sometimes performed. At this time, when there is the hollow part 23 in the hole 20A, 20B, there is a possibility that the plating solution penetrating into a gap between the substrate 12 and the insulation layer 33, 38 and the substrate 12 enters the hollow part 23 of the hole 20A, 20B.

In addition, when a step of removing a portion of the electroconductive layer such as the seed layer 41 and the plating layer 42, which is present on the first surface 13 and the second surface 14 of the substrate 12, by the chemical mechanical grinding method is performed, there is a possibility that debris of the electroconductive material remain as a residue in the hollow part 23 in the hole 20A, 20B.

As one of applications of the through electrode substrate 10, there is an application of manufacturing a device by mounting an element on the through electrode substrate 10, and then by encapsulating the element with resin. In this case, a solution containing resin is supplied to the through electrode substrate 10 and the solution is solidified so as to form the resin that encapsulates the element. At this time, when there is the hollow part 23 in the hole 20A, 20B, there is a possibility that the solution containing the resin entering a gap between the substrate 12 and the insulation layer 33, 38 enters the hollow part 23 in the hole 20A, 20B.

On the other hand, according to this modification example, by providing the filling member 25 inside the hole 20A, 20B, it is possible to inhibit an undesired substance from entering the inside of the hole 20A, 20B. Thus, a yield of the through electrode substrate 10 and a product using the through electrode substrate 10 can be improved and/or the quality of the through electrode substrate 10 can be improved.

Manufacturing Method of Through Electrode Substrate

Herebelow, an example of the manufacturing method of the through electrode substrate 10 is described with reference to FIGS. 8A and 8B.

Firstly, similarly to the above embodiment, the seed layer 41 and the plating layer 42 are formed on the holes 20A and 20B of the substrate 12 to obtain the aforementioned intermediate product shown in FIG. 3E. Then, as shown in FIG. 8A, the first insulation layer 33 is provided on the first surface 13 of the substrate 12. To be specific, a film including the first insulation layer 33 and a support layer is prepared. Then, in an environment where a pressure of a surrounding atmosphere is a first pressure, the film is attached to the first surface 13 of the substrate 12 to provide the first insulation layer 33 on the first surface 13. Similarly, the second insulation layer 38 is provided on the second surface 14 of the substrate 12.

Then, the substrate 12 provided with the first insulation layer 33 and the second insulation layer 38 is placed in an environment where a pressure of a surrounding atmosphere is a second pressure that is higher than the first pressure. As a result, because of the difference between the pressure inside the holes 20A and 20B and the pressure around the insulation layers 33 and 38, the insulation layers 33 and 38 are driven into the holes 20A and 20B. In this manner, the filling members 25 can be provided inside the holes 20A and 20B.

Thereafter, the aperture parts are formed in the insulation layers 33 and 38, and the electrode parts 31 and 36 are formed in the aperture parts of the insulation layers 33 and 38. In this manner, it is possible to obtain the through electrode substrate 10 in which the filling members 25 are provided inside the holes 20A and 20B.

As long as the second pressure is higher than the first pressure, specific values of the first pressure and the second pressure are not particularly limited. For example, the first pressure is not more than 300 Torr, and the second pressure is an atmospheric pressure. In addition, a difference between the first pressure and the second pressure is not less than 460 Torr. When a pressure between the first pressure and the second pressure is small, or flowability of the insulation layer 33, 38 is low, as shown in FIG. 9, there is a possibility that the inside of the hole 20A, 20B is not completely filled with the filling member 25, so that a gap 26 remains.

The above embodiment shows the example in which the insulation material constituting the filling member 25 filled in the hole 20A, 20B and the insulation material constituting the insulation layers 33 and 38 covering the first surface 13 and the second surface 14 of the substrate 12 are the same with each other. However, not limited thereto, the insulation material constituting the filling member 25 and the insulation material constituting the insulation layer 33, 38 may differ from each other.

In addition, also in the embodiment, similarly to the first modification example of the above first embodiment, the second holes 20B may include a non-through hole. In addition, also in this embodiment, similarly to the second modification example or the third modification example of the above first embodiment, the order of forming the hole electrode parts 22, the wirings 32 and 37 and the insulation layers 33 and 38 is not particularly limited.

Third Embodiment

Next, a third embodiment is described with reference to FIG. 10 through FIG. 11E.

The third embodiment differs from the first embodiment only in that the hole 20A, 20B is filled with the hole electrode part 22, and is substantially the same in other structure. In the third embodiment, the same part as that of the first embodiment is shown by the same reference number, and detailed description thereof is omitted. In addition, when the effect obtained in the first embodiment is apparently obtained also in the third embodiment, description thereof may be omitted.

Figure 10:
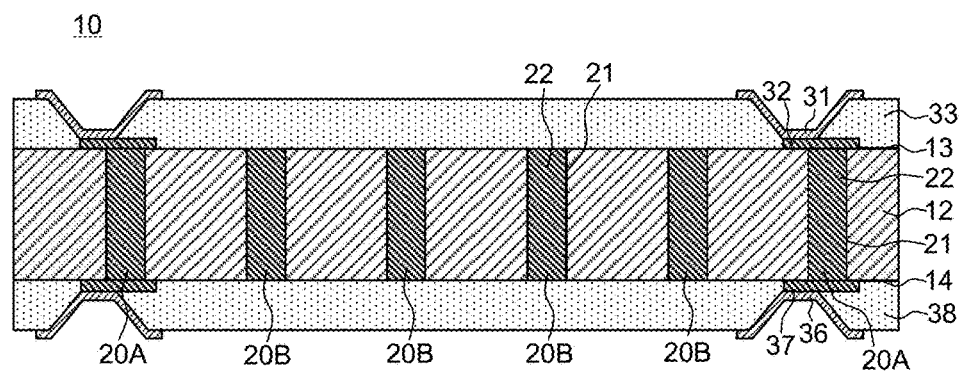
FIG. 10 is a sectional view showing a through electrode substrate according to a third embodiment.

FIG. 10 is a sectional view showing the through electrode substrate 10 according to this embodiment. In this embodiment, the hole electrode parts 22 are filled inside the holes 20A and 20B. By filling the inside of the holes 20A and 20B with a solid body, also in this embodiment, similarly to the above second embodiment, it is possible to inhibit an undesired substance from entering the inside of the hole 20A, 20B.

Manufacturing Method of Through Electrode Substrate

Figure 11A:
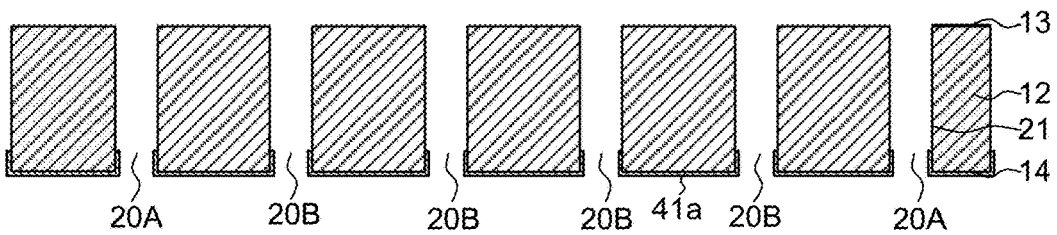
FIG. 11A is a view showing a step of forming a first seed layer on a second surface side of a substrate.

Herebelow, an example of the manufacturing method of the through electrode substrate 10 is described with reference to FIG. 11A thorough 11E.

Firstly, similarly to the above embodiments, a plurality of the holes 20A and 20B are formed in the substrate 12 to obtain the aforementioned intermediate product shown in FIG. 3A. Then, as shown in FIG. 11, a first seed layer 41a is formed on the second surface 14 side of the substrate 12. To be specific, the seed layer 41a is formed on the second surface 14 of the substrate 12 and a portion of the sidewall 21 of the hole 20A, 20B, which is connected to the second surface 14. As a method of forming the first seed layer 41a, a physical film deposition method such as a vapor deposition method or a sputtering method, or a chemical film deposition method may be used, similarly to the seed layer 41.

Figure 11B:
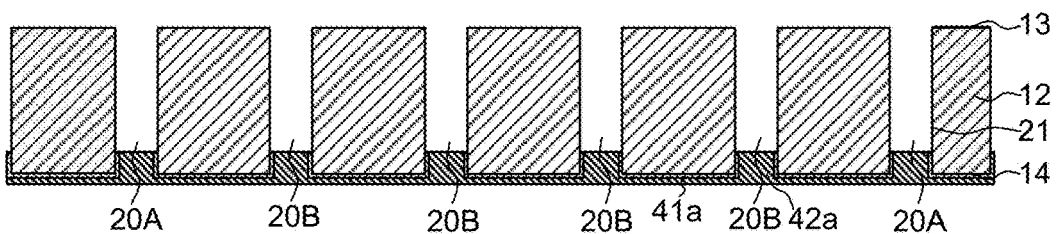
FIG. 11B is a view showing a step of forming a first plating layer on the second surface side of the substrate.

Then, as shown in FIG. 11B, a plating solution is supplied to the substrate 12 to form a first plating layer 42a on the first seed layer 41a. At this time, as shown in FIG. 11B, since the first plating layer 42a deposits concentrically on the holes 20A and 20B where an electric field density is high, the holes 20A and 20B can be closed by the first plating layer 42a on the second surface 14 side.

Figure 11C:
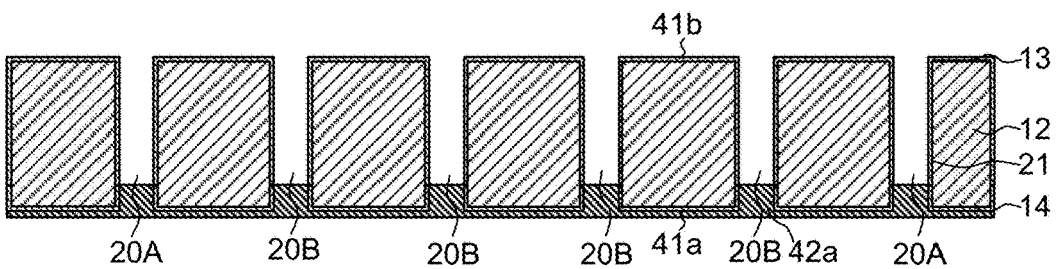
FIG. 11C is a view showing a step of forming a second seed layer on a first surface of the substrate and a sidewall of a hole from a first surface side of the substrate.

Then, as shown in FIG. 11C, a second seed layer 41b is formed from the first surface 13 side of the substrate 12 on the first surface 13 and the sidewall 21 of the hole 20A, 20B. As a method of forming the second seed layer 41b, a physical film deposition method such as a vapor deposition method or a sputtering method, or a chemical film deposition method may be used, similarly to the seed layer 41 and the second seed layer 41b.

Figure 11D:
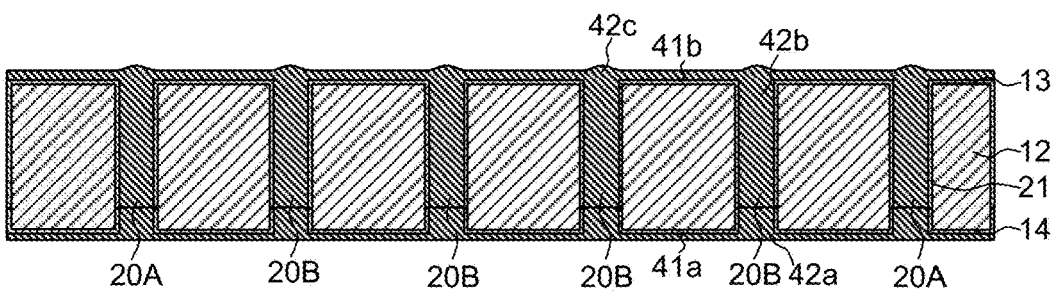
FIG. 11D is a view showing a step of forming a second plating layer on the second seed layer from the first surface side of the substrate.

Then, as shown in FIG. 11D, a plating solution is supplied to the substrate 12 to form a second plating layer 42b on the second seed layer 41b and the first plating layer 42a. For example, as shown in FIG. 11D, this step is performed until a convex portion 42c, which is convex on the first surface 13 side at a position corresponding to the hole 20A, 20B, is formed on the second plating layer 42b.

Figure 11E:
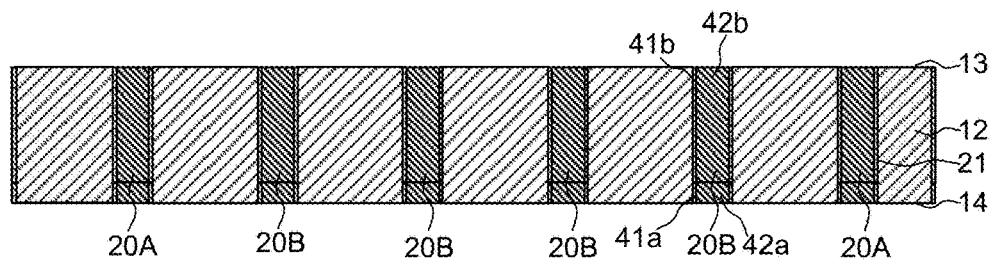
FIG. 11E is a view showing a step of removing the plating layer and the seed layer on the first surface and the second surface of the substrate.

Then, as shown in FIG. 11E, portions of the seed layers 41a and 41b and the plating layers 42a and 42b, which are present on the first surface 13 and the second surface 14 of the substrate 12, are removed. For example, a chemical mechanical grinding method may be used as a method of removing the seed layers 41a and 41b and the plating layers 42a and 42b on the first surface 13 and the second surface 14.

Thereafter, the wirings 32 and 37, the insulation layers 33 and 38 and the electrode parts 31 and 36 are formed on the first surface 13 and the second surface 14. Thus, it is possible to obtain the through electrode substrate 10 in which the hole electrode parts 22 are filled inside the holes 20A and 20B.

In this embodiment, as described above, the step of removing the portions of the seed layers 41a and 41b and the plating layers 42a and 42b, which are present on the first surface 13 and the second surface 14, by the chemical mechanical grinding method is performed. Herein, in this modification example, by forming the first holes 20A and the second holes 20B in the substrate 12, the convex portions 42c of the second plating layer 42b formed at positions corresponding to the holes 20A and 20B can be more uniformly distributed on the first surface 13 of the substrate 12. Thus, when the chemical mechanical grinding method is performed, it is possible to inhibit that the pressure applied to the second plating layer 42b varies from place to place. As a result, generation of residue of the electroconductive material can be inhibited.

Also in this embodiment, similarly to the first modification example of the above first embodiment, the second holes 20B 20B may include a non-through hole. In addition, also in this embodiment, similarly to the second modification example or the third modification example of the above first embodiment, the order of forming the hole electrode parts 22, the wirings 32 and 37 and the insulation layers 33 and 38 is not particularly limited.

Fourth Embodiment

Next, a fourth embodiment is described with reference to FIG. 12A. The fourth embodiment differs from the first embodiment only in that the hole electrode part 22 of the hole 20B is connected to the first electrode part 31 or the second electrode part 36, and is substantially the same in other structure. In the fourth embodiment, the same part as that of the first embodiment is shown by the same reference number, and detailed description thereof is omitted. In addition, when the effect obtained in the first embodiment is apparently obtained also in the third embodiment, description thereof may be omitted.

In this embodiment, the second hole 20B is defined as a hole whose electrode part 22 is electrically connected to an electrode part on one of the first surface 13 side and the second surface 14 side of the substrate 12, and whose electrode part 22 is electrically insulated from an electrode part on the other of the first surface 13 side and the second surface 14 side. For example, as shown in FIG. 12A, the hole electrode part 22 provided on the second hole 20B is electrically connected to the first electrode part 31 on the first surface 13 side of the substrate 12, and is electrically insulated from the second electrode part 36 on the second surface 14 side of the substrate 12. Alternatively, although not shown, the hole electrode part 22 provided on the second hole 20B may be electrically insulated from the first electrode part 31 on the first surface 13 side of the substrate 12, and may be electrically connected to the second electrode part 36 on the second surface 14 side of the substrate 12.

Also in this embodiment, by forming the first holes 20A and the second holes 20B in the substrate 12, the distribution density of the holes 20 in the substrate 12 can be made more uniform. Thus, it can be inhibited that the rigidity and the deformability of the substrate 12 vary from place to place. Therefore, in a manufacturing step of the through electrode substrate 10 and a manufacturing step of a product using the through electrode substrate 10, the substrate 12 can be inhibited from warping and/or distorting.

Modification Example

Figure 12A:
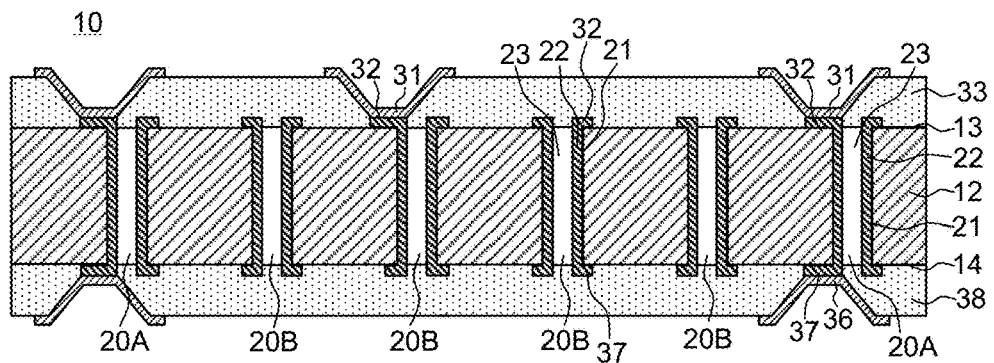
FIG. 12A is a sectional view showing a through electrode substrate according to a fourth embodiment.
Figure 12B:
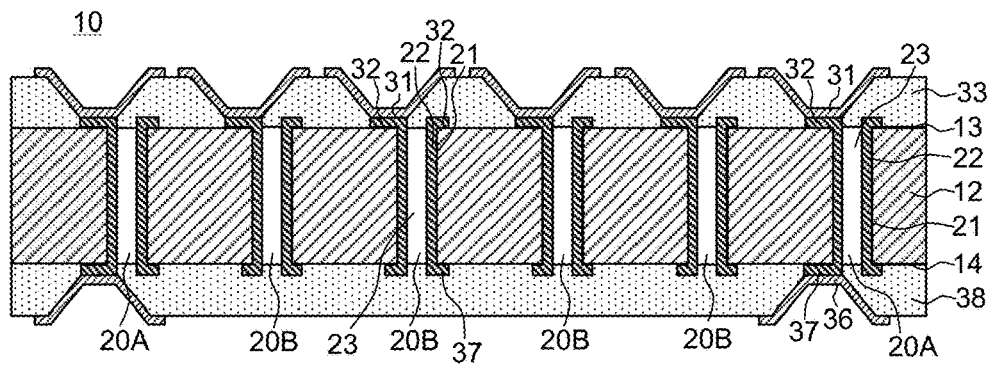
FIG. 12B is a sectional view showing a through electrode substrate according to one modification example of the fourth embodiment.

FIG. 12A shows the example in which the electrode parts 22 of some of the second holes 20B are electrically connected to the first electrode parts 31 on the first surface 13 side of the substrate 12, and are electrically insulated from the second electrode parts 36 on the second surface 14 side of the substrate 12. However, not limited thereto, as shown in FIG. 12B, the hole electrode parts 22 of all the second holes 20B may be electrically connected to the first electrode parts 31 on the first surface 13 side of the substrate 12, and may be electrically insulated from the second electrode parts 36 on the second surface 14 side of the substrate 12. Alternatively, although not shown, the hole electrode parts 22 of all the second holes 20B may be electrically insulated from the first electrode parts 31 on the first surface 13 side of the substrate 12, and may be electrically connected to the second electrode parts 36 on the second surface 14 side of the substrate 12.

Figure 12C:
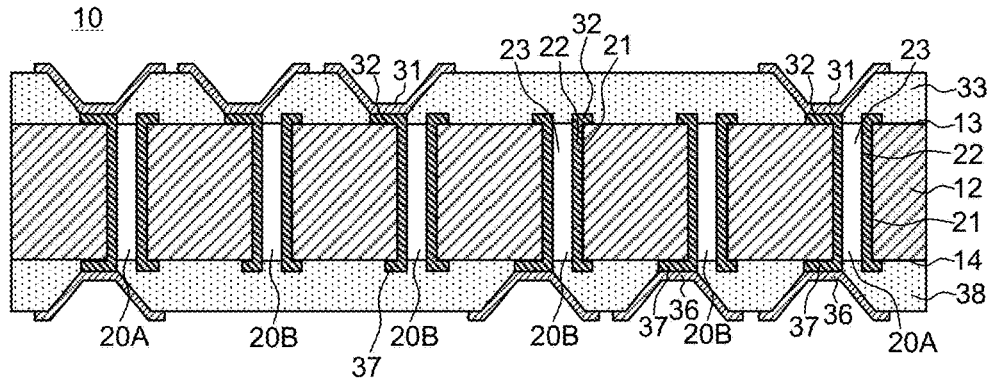
FIG. 12C is a sectional view showing the through electrode substrate according to the one modification example of the fourth embodiment.

In addition, as shown in FIG. 12C, the hole electrode parts 22 of some of the second holes 20B may be electrically connected to the first electrode parts 31, and the hole electrode parts 22 of all the other second holes 20B may be electrically connected to the second electrode parts 36. In this case, the electrode part 22 electrically connected to the first electrode part 31 on the first surface 13 side of the substrate 12 is electrically insulated from the second electrode part 36 on the second surface 14 side of the substrate 12. In addition, the hole electrode part 22 electrically insulated from the first electrode part 31 on the first surface 13 side of the substrate 12 is electrically connected to the second electrode part 36 on the second surface 14 side of the substrate 12.

The first electrode parts 31 and the second electrode parts 36 connected to the hole electrode parts 22 of the second holes 20B may be regularly distributed. For example, when the hole electrode parts 22 of the second holes 20B are seen along the plane direction of the substrate 12, the hole electrode parts 22 connected to the first electrode parts 31 and the hole electrode parts 22 connected to the second electrode parts 36 may be alternately arranged. Alternatively, the first electrode parts 31 and the second electrode parts 36 connected to the hole electrode parts 22 of the second holes 20B may be irregularly distributed.

As shown in FIG. 12A through FIG. 12C, by connecting the electrode part 22 of the hole 20B to the first electrode part 31 or the second electrode part 36, an electric charge accumulated in the hole electrode part 22 of the hole 20B can be electrically discharged outside through the first electrode part 31 or the second electrode part 36. In addition, by connecting the first electrode parts 31 or the second electrode parts 36 to the hole electrode part 22 of the hole 20B, the first electrodes 31 or the second electrodes 36 can be uniformly distributed in the plane direction of the substrate 12, as compared with the case in which the first electrode parts 31 or the second electrode parts 36 are connected only to the hole electrode parts 22 of the holes 20A. Thus, for example, when a stress is generated between the first electrode part 31 or the second electrode part 36 and the first wiring 32 or the second wiring 37, it is possible to inhibit that the substrate 12 or the below-described wafer 60 is warped by means of the stress. In addition, when the first electrode 31 or the second electrode 36 is formed by plating, it is possible to inhibit that the thickness of the first electrode 31 or the second electrode 36 varies from place to place, and that the first electrode 31 or the second electrode 36 has irregularities.

Fifth Embodiment

Next, a fifth embodiment is described with reference to FIG. 13A. The fifth embodiment differs from the first embodiment only in that the hole electrode part 22 of the hole 20B is connected to a dummy wiring, and is substantially the same in other structure. In the fifth embodiment, the same part as that of the first embodiment is shown by the same reference number, and detailed description thereof is omitted. In addition, when the effect obtained in the first embodiment is apparently obtained also in the third embodiment, description thereof may be omitted.

In this embodiment, the hole electrode part 22 of the second hole 20B is connected to a dummy wiring on the first surface 13 side or the second surface 14 side of the substrate 12. For example, as shown in FIG. 13A, the hole electrode part 22 provided on the second hole 20B is connected to a dummy wiring 34 on the first surface 13 side of the substrate 12. The dummy wiring 34 is a wiring that is provided on the first surface or the second surface 14 of the substrate 12 and is not connected to the first electrode part 31 or the second electrode part 36. In the example shown in FIG. 13A, the dummy wiring 34 is provided on the first surface 13 of the substrate 12, and is covered with the first insulation layer 33. Alternatively, although not shown, the hole electrode part 22 provided on the second hole 20B may be connected to a dummy wiring provided on the second surface 14 of the substrate 12. In addition, the hole electrode 22 provided on the second hole 20B may be connected to dummy wirings both on the first surface 13 side and on the second surface 14 side.

Also in this embodiment, by forming the first holes 20A and the second holes 20B in the substrate 12, the distribution density of the holes 20 in the substrate 12 can be made more uniform. Thus, it can be inhibited that the rigidity and the deformability of the substrate 12 vary from place to place. Therefore, in a manufacturing step of the through electrode substrate 10 and a manufacturing step of a product using the through electrode substrate 10, the substrate 12 can be inhibited from warping and/or distorting.

Modification Example

Figure 13A:
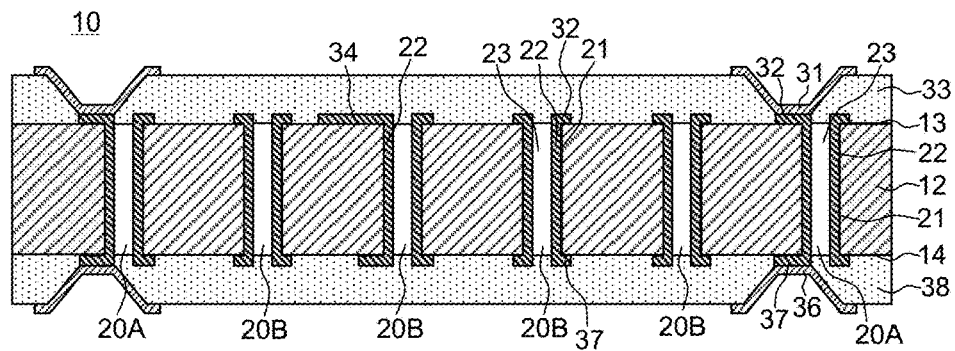
FIG. 13A is a sectional view showing a through electrode substrate according to a fifth embodiment.
Figure 13B:
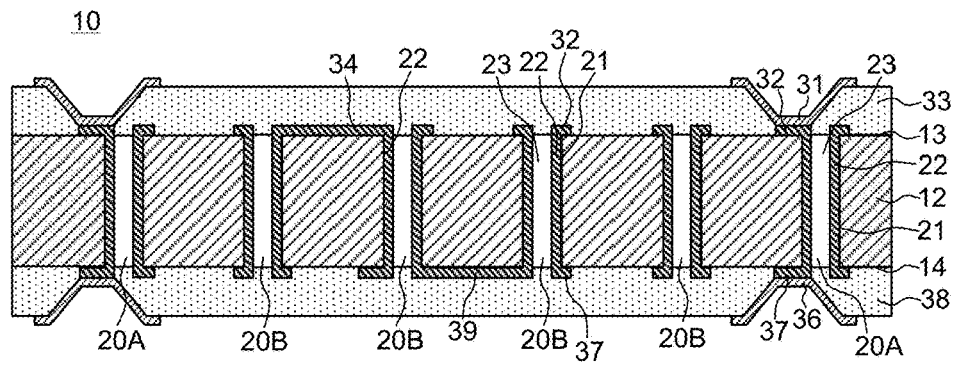
FIG. 13B is a sectional view showing a through electrode substrate according to one modification example of the fifth embodiment.

FIG. 13A shows the example in which one dummy wiring 34 is connected to the hole electrode part 22 of one second hole 20B. However, not limited thereto, one dummy wiring 34 may be connected to the hole electrode parts 22 of a plurality of the second holes 20B. For example, as shown in FIG. 13B, one dummy wiring 34 may be connected to both the hole electrode parts 22 of the two second holes 20B. In other words, the hole electrode parts 22 of two second holes 20B may be electrically connected by the dummy wiring 34 on the first surface 13 side of the substrate 12. In addition, the hole electrode parts 22 of two second holes 20B may be connected by a dummy wiring 39 on the second surface 14 side of the substrate 12. The hole electrode parts 22 of the two second holes 20B, which are electrically connected by the dummy wiring 34 or the dummy wiring 39, may be the hole electrode parts 22 of the two second holes 20B adjacent to each other, or may be the hole electrode parts 22 of the two second holes 20B that are not adjacent to each other.

Figure 13C:
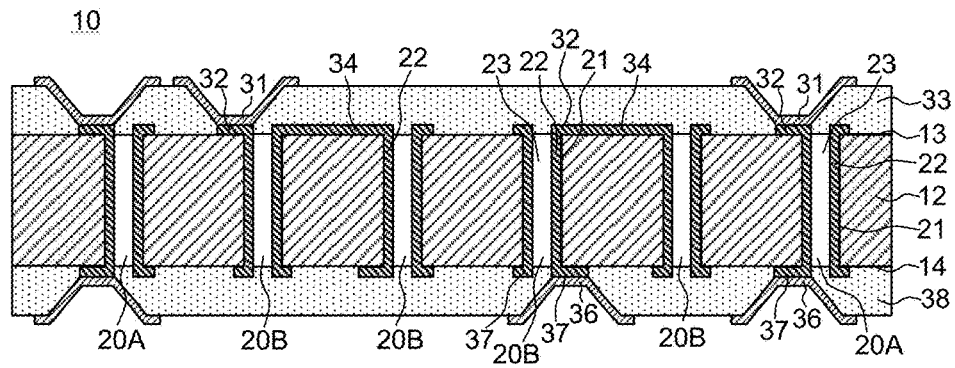
FIG. 13C is a sectional view of the through electrode substrate according to the one modification example of the fifth embodiment.

In addition, as shown in FIG. 13C, the first electrode part 31 or the second electrode part 36 may further be connected to the hole electrode part 22 of the second hole 20B, which is electrically connected to the hole electrode part 22 of another second hole 20B by the dummy wiring 34 or the dummy wiring 39. In this case, the dummy wiring and the electrode part connected to the hole electrode part 22 of one second hole 20B may be positioned on the same side of the substrate 12. For example, as shown in FIG. 13C, the first electrode part 31 may be connected on the first surface 13 side to the hole electrode part 22 of the second hole 20B, which is connected to the hole electrode part 22 of another second hole 20B on the first surface 13 side of the substrate 12 by the dummy wiring 34. Alternatively, the dummy wiring and the electrode part connected to the hole electrode part 22 of one second hole 20B may be positioned on the different sides of the substrate 12. For example, as shown in FIG. 13C, the second electrode part 36 may be connected on the second surface side 14 to the hole electrode part 22 of the second hole 20B, which is connected to the hole electrode part 22 of another second hole 20B on the first surface 13 side of the substrate 12 by the dummy wiring 34. According to the example shown in FIG. 13C, similarly to the examples shown in FIG. 12A through FIG. 12C, an electric charge accumulated in the hole electrode part 22 of the hole 20B can be electrically discharged outside through the first electrode part 31 or the second electrode part 36.

In addition, as shown in FIG. 13A through FIG. 13C, by providing the dummy wiring 34 on the first surface 13 or by providing the dummy wiring 39 on the second surface 14, the wirings can be more uniformly distributed on the first surface 13 or the second surface 14. Thus, for example, when a stress is generated between the wiring on the first surface 13, such as the first wiring 32 and/or the dummy wiring 34, and the substrate 12, it is possible to inhibit that the substrate 12 is warped by means of the stress. Similarly, when a stress is generated between the wiring on the second surface 14, such as the second wiring 37 and/or the dummy wiring 39, and the substrate 12, it is possible to inhibit that the substrate 12 or the below-described wafer 60 is warped by means of the stress. In addition, when the wiring on the first surface 13 and the wiring on the second surface 14 are formed by plating, it is possible to inhibit that the thickness of each wiring varies from place to place, and that each wiring has irregularities.

Sixth Embodiment

Figure 14:
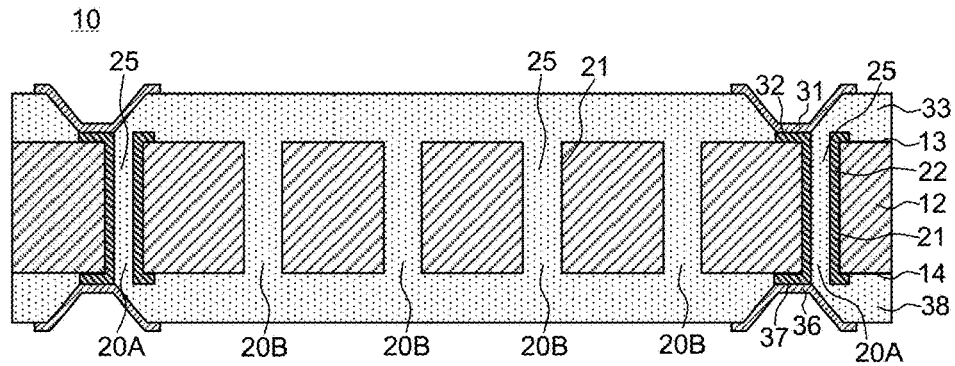
FIG. 14 is a sectional view of a through electrode substrate according to a sixth embodiment.
Figure 15A:
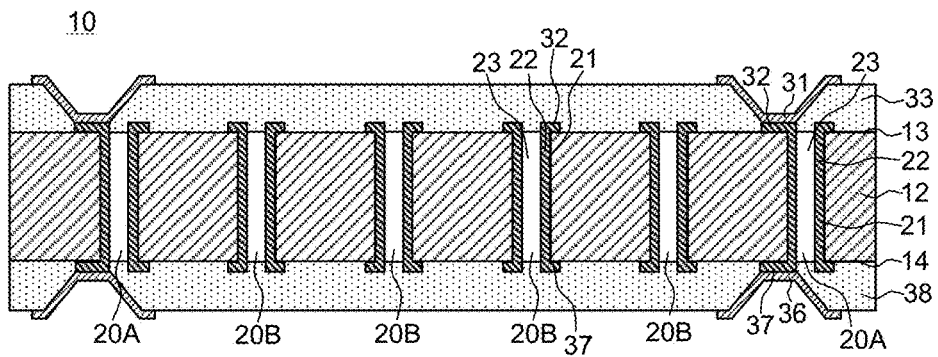
FIG. 15 is a view showing variations of the holes explained in the respective embodiments.
Figure 15B:
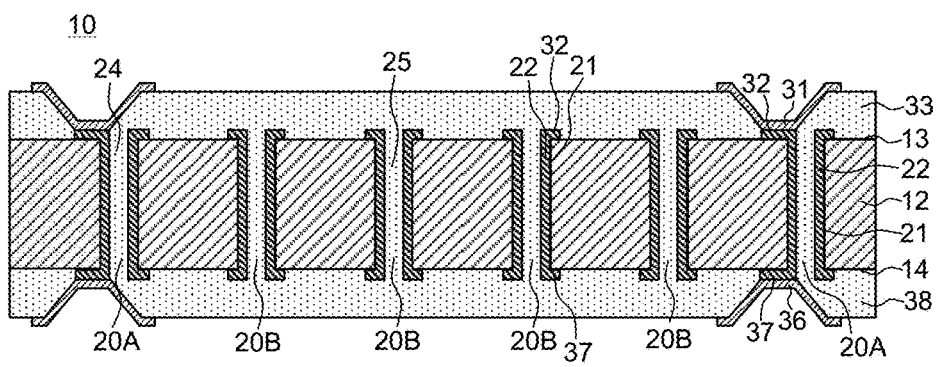
Figure 15C:
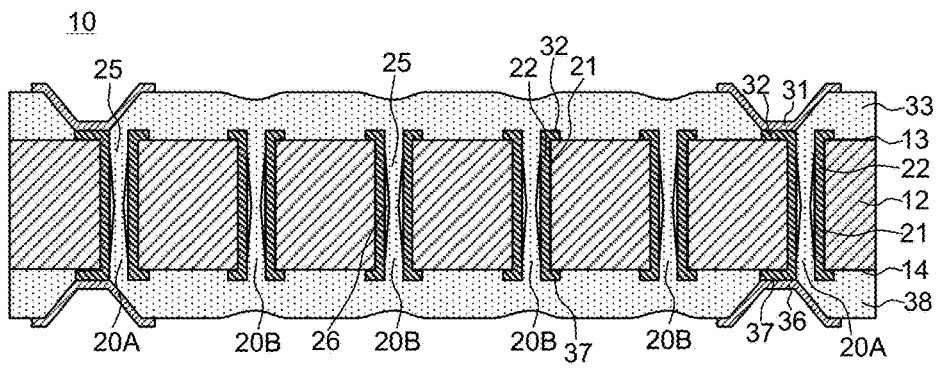
Figure 15D:
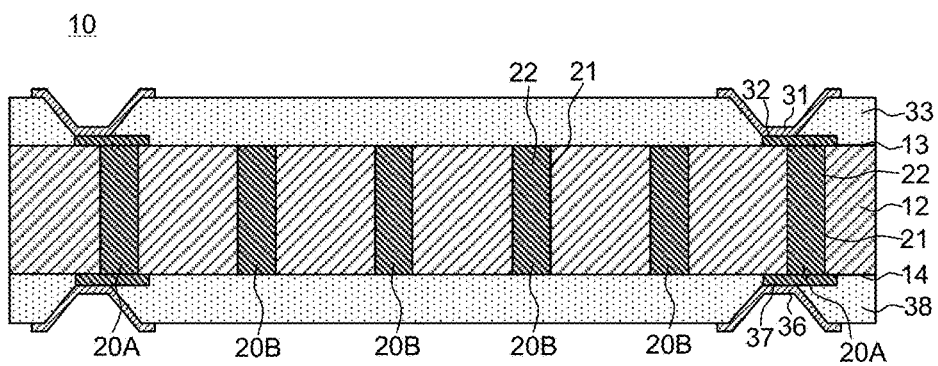

Next, a sixth embodiment is described with reference to FIG. 14. The sixth embodiment differs from the second embodiment only in that the hole 20B is not provided with the hole electrode part 22, and is substantially the same in other structure. In the sixth embodiment, the same part as that of the second embodiment is shown by the same reference number, and detailed description thereof is omitted. In addition, when the effect obtained in the second embodiment is apparently obtained also in the third embodiment, description thereof may be omitted.

In this embodiment the first hole 20A and the second hole 20B are filled with the filling members 25. On the other hand, the first hole 20A is provided with the hole electrode part 22, while the second hole 20B is not provided with the hole electrode part 22. Although not shown, the inside of the hole 20A, 20B is not completely filled with the filling member 25, so that a gap 26 remains, as shown in FIG. 9. In addition, the insulation material constituting the filling member 25 and the insulation material constituting the insulation layer 33, 38 may be the same with each other or differ from each other.

Also in this embodiment, by providing the filling member 25 inside the hole 20A, 20B, it is possible to inhibit an undesired substance from entering the inside of the hole 20A, 20B. Thus, a yield of the through electrode substrate 10 and a product using the through electrode substrate 10 can be improved and/or the quality of the through electrode substrate 10 can be improved.

[Variations of Hole]

Variations of the hole 20A, 20B described in the above first to third embodiments are shown in FIG. 15. FIG. 15(a) shows the hole 20A, 20B inside which the hollow part 23 is formed, which is described in the above first embodiment. FIG. 15(b) shows the hole 20A, 20B inside which the filling member 25 is provided, which is described in the above second embodiment. FIG. 15(c) shows the hole 20A, 20B in which the gap 26 is formed between the hole electrode part 22 and the filling member 25, which is described in the modification example of the above second embodiment. FIG. 15(d) shows the hole 20A, 20B whose inside is filled with the hole electrode part 22, which is described in the modification example of the above third embodiment.

[Modification Example of Positioning of Holes]

The above first embodiment shows the example in which the holes 20 are aligned along a direction in which the outer periphery of the substrate 12 extends in a plan view. However, as long as the distribution density of the holes 20 in the substrate 12 can be made more uniform, the specific positioning of the holes 20 is not particularly limited.

Figure 16:
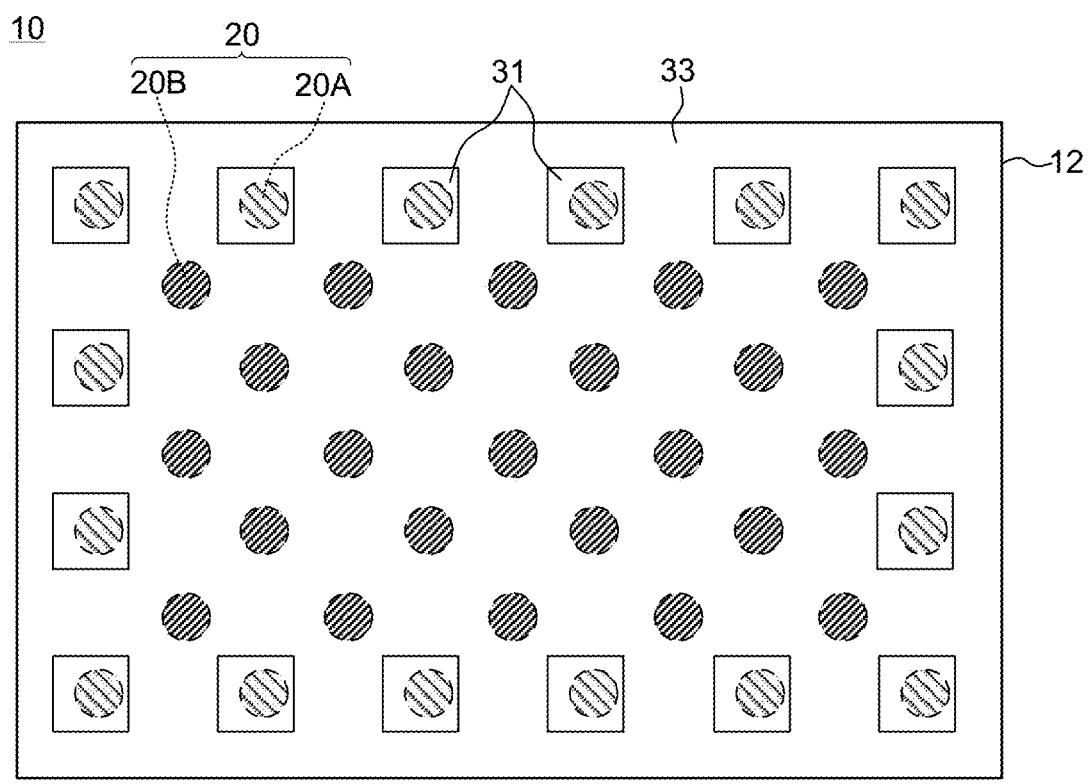
FIG. 16 is a plan view showing a first modification example of positioning of a plurality of holes.
Figure 17:
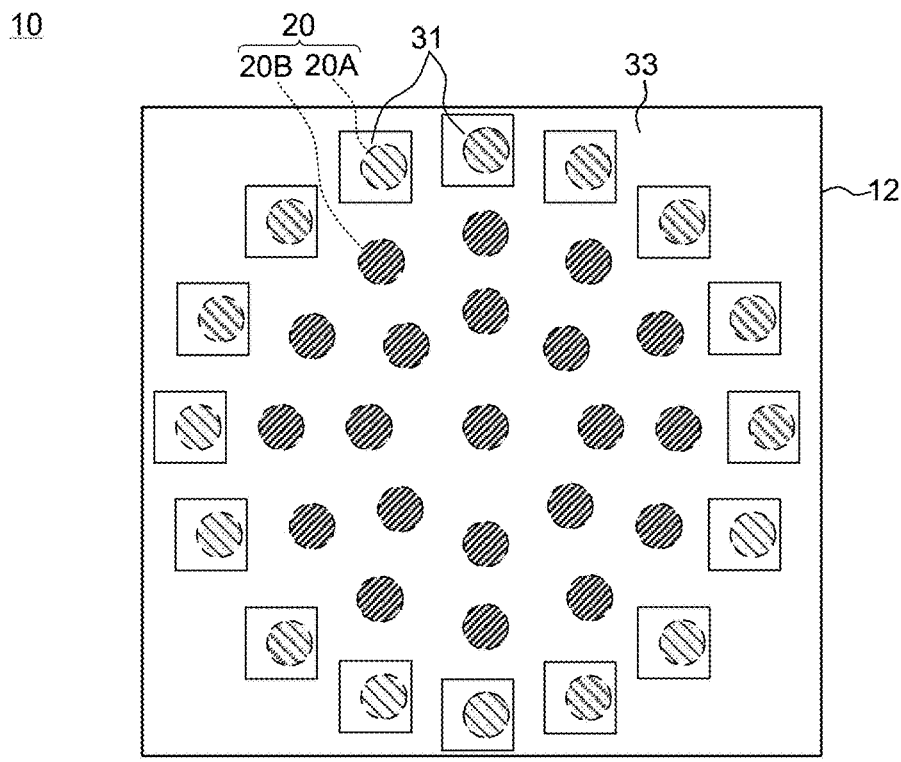
FIG. 17 is a plan view showing a second modification example of the positioning of a plurality of the holes.

For example, as shown in FIG. 16, the holes 20 may be aligned in a direction that is deviated from the direction in which the outer periphery of the substrate 12 extends. In addition, as shown in FIG. 17, the holes 20 may be concentrically aligned.

Figure 18:
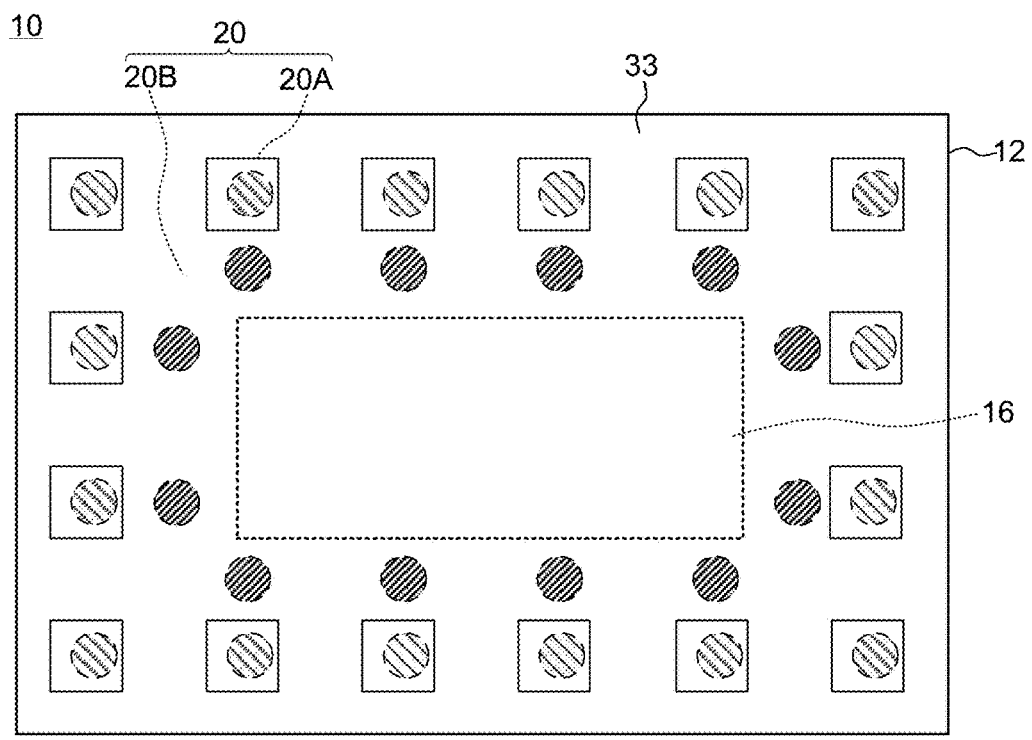
FIG. 18 is a plan view showing a third modification example of the positioning of a plurality of the holes.

In addition, although the above first embodiment shows the example in which the distribution density of the holes 20 is uniform irrespective of place, the present invention is not limited thereto. For example, as shown in FIG. 18, the substrate 12 may have a hole-free area 16 free of hole 20. For example, the hole-free area 16 is present inside an area where the first holes 20A and the second holes 20B are arranged. Herebelow, an advantage of providing such a hole-free area 16 is described with reference to FIG. 19.

Figure 19:
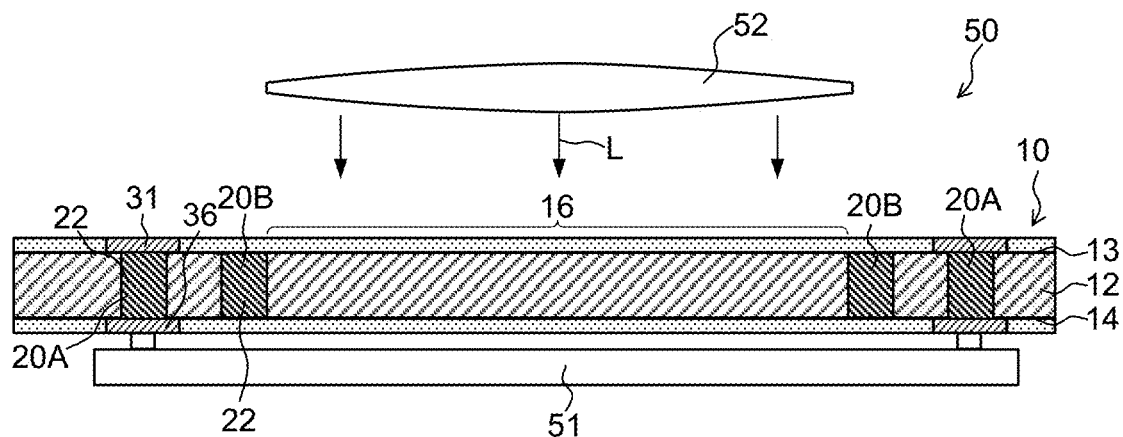
FIG. 19 is a view showing one application example of a through electrode substrate shown in FIG. 18.

FIG. 19 is a sectional view showing an optical device 50 comprising the through electrode substrate 10, which is one application example of the through electrode substrate 10 shown in FIG. 18. For example, the optical device 50 is an image sensor module for camera. The optical device 50 comprises the through electrode substrate 10 provided with the hole-free area 16 on a center part of the substrate 12, a lens 52 that guides light L to the hole-free area 16 of the through electrode substrate 10, and a light receiving element 51 that receives the light L having transmitted through the hole-free area 16. According to the optical device 50 shown in FIG. 19, by providing the substrate 12 with the hole-free area 16, the light L having transmitted through the lens 52 can be caused to reach the light receiving element 51, while inhibiting generation of unintended reflection.

Figure 20:
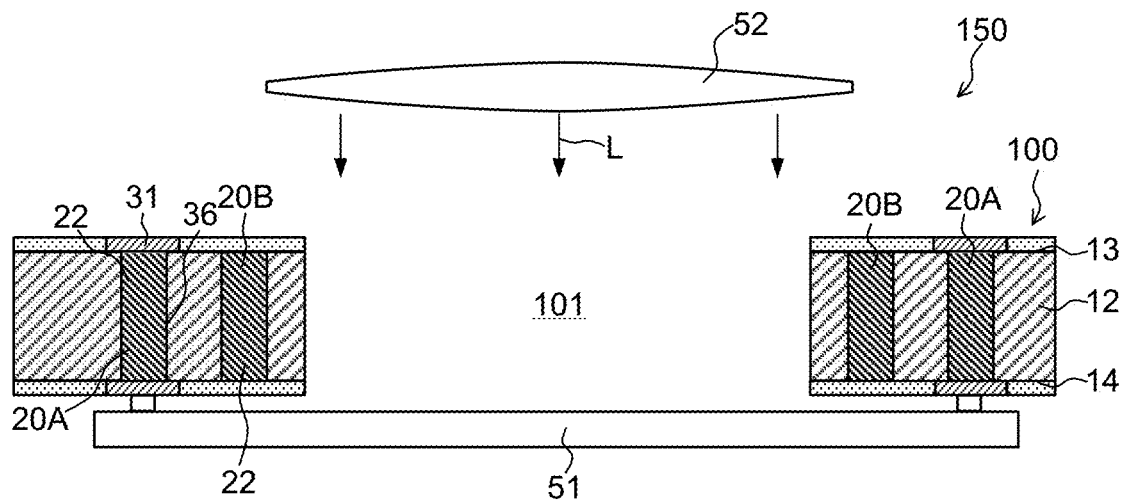
FIG. 20 is a view showing one example of a through electrode substrate in which an aperture is formed.

As a comparison with the optical device 50 shown in FIG. 19, an optical device 150 and a through electrode substrate 100, which are shown in FIG. 20, are considered. In order to cause the light L having transmitted through the lens 52 to reach the light receiving element 51, the substrate 12 has an aperture part 101 that is formed in an area through which the light L passes. In this case, since the light L passes through the aperture part, generation of unintended reflection can be prevented. On the other hand, since the aperture part is formed in the center part of the substrate 12 of the through electrode substrate, the rigidity of the substrate 12 is low. Thus, in order to sufficiently ensure the rigidity of the substrate 12 as a whole, the thickness of the substrate 12 is required to be enlarged.

On the other hand, according to the optical device 50 shown in FIG. 19, since no aperture part is formed in an area of the substrate 12 through which the light L passes, the rigidity of the substrate 12 is higher than the case in which the aperture part is formed. Thus, the thickness of the substrate 12 can be smaller as compared with the case in which the aperture part is formed. As a result, an attenuance when the light passes through the hole-free area 16 of the substrate 12 can be reduced.

In addition, also in the through electrode substrate 10 of the optical device 50 shown in FIG. 19, an area of the substrate 12 other than the hole-free area 16 is provided with a plurality of the second holes 20B in addition to a plurality of the first holes 20A, similarly to the respective above embodiments. Thus, it can be inhibited that the rigidity and the deformability of the substrate 12 vary from place to place, as compared with the case in which only the first holes 20A are provided. As a result, in a manufacturing step of the through electrode substrate 10 or the optical device 50, the substrate 12 can be inhibited from warping and/or distorting.

Figure 21:
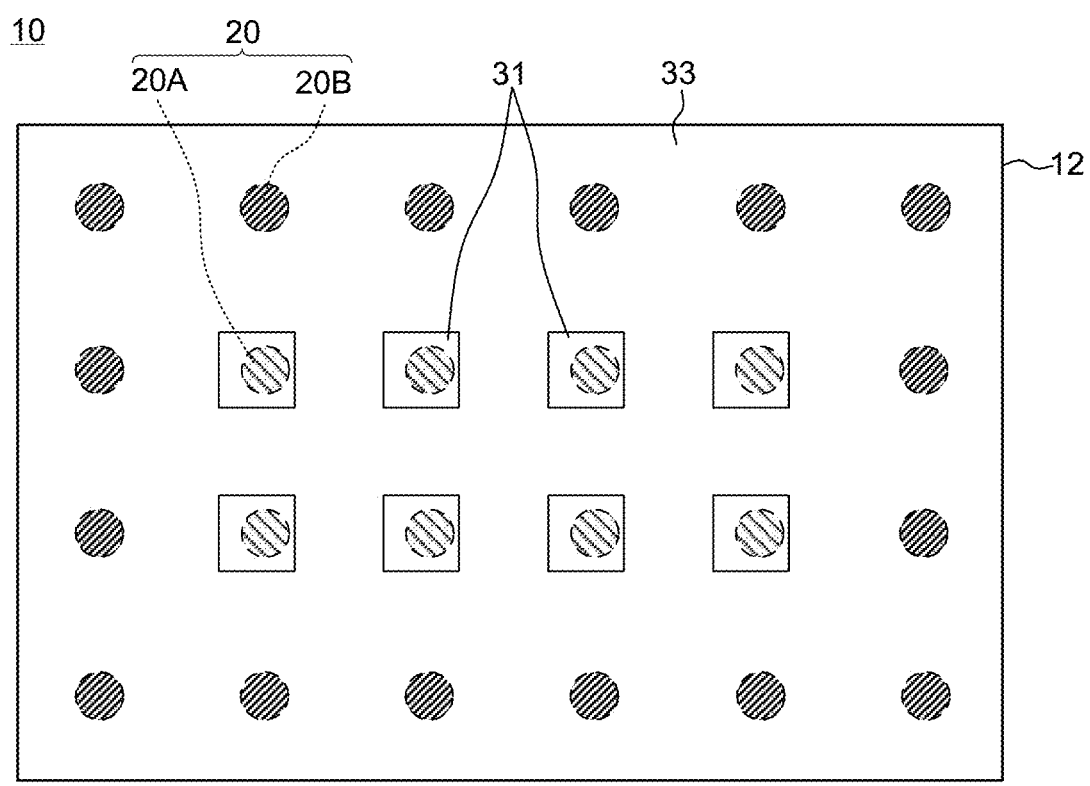
FIG. 21 is a plan view showing the third modification example of the positioning of a plurality of the holes.

Although the above first embodiment shows the example in which the second holes 20B are arranged in an area inside an area in which the first holes 20A are arranged, the present invention is not limited thereto. For example, as shown in FIG. 21, the second holes 20B may be arranged in an area outside an area in which the first holes 20A are arranged.

[Example of Assigning Through Electrode Substrates on Wafer]

Figure 22:
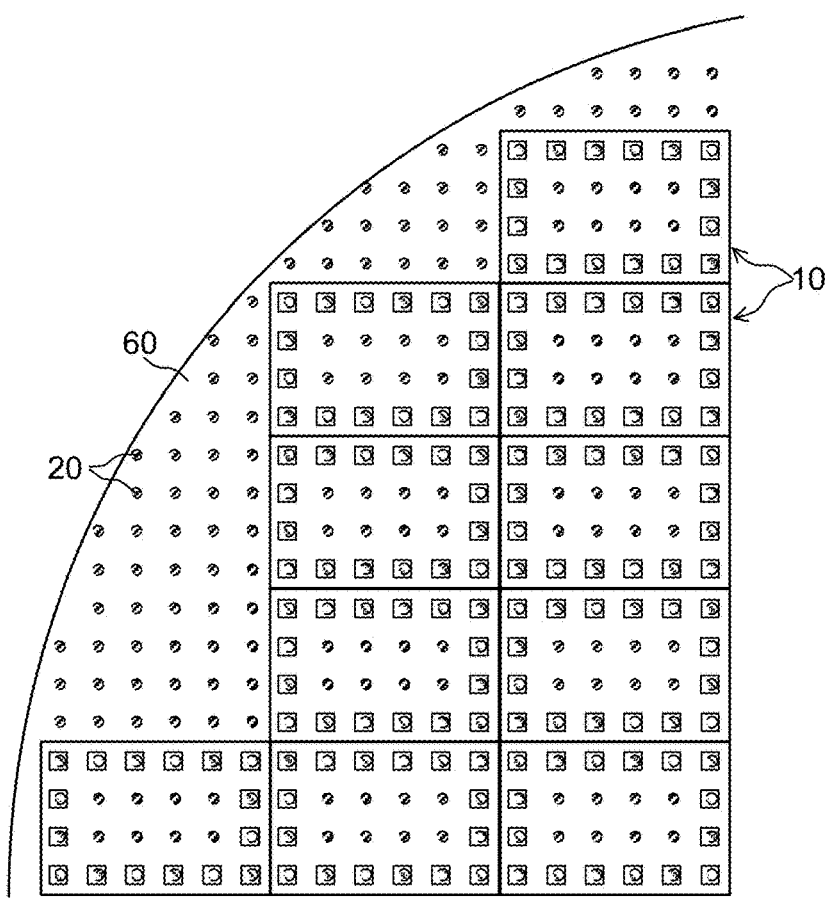
FIG. 22 is a plan view showing an example in which a plurality of through electrode substrates are assigned to a wafer.

As shown in FIG. 22, in a manufacturing method of the through electrode substrate 10, a large substrate such as a wafer 60 is processed such that a plurality of the through electrode substrates 10 may be formed on the wafer 60, and thereafter the wafer 60 may be cut to obtain the discrete through electrode substrates 10. In this case, as shown in FIG. 22, the holes 20 may be formed in an area where no through electrode substrate 10 is formed. The holes 20 formed in the area where no through electrode substrate 10 is formed may be either the first holes 20A or the second holes 20B. By forming the holes 20 in the area where no through electrode substrate 10 is formed, it can be inhibited that the rigidity and the deformability of the wafer 60 vary from the area where the through electrode substrate 10 is formed, to the area where no through electrode substrate 10 is formed. Thus, in a manufacturing step of the through electrode substrate 10 and a manufacturing step of a product using the through electrode substrate 10, the wafer 60 can be inhibited from warping and/or distorting. In addition, when the wafer 60 is subjected to a plating process, it is possible to inhibit that the thickness of a plating layer varies from place to place, and that the plating layer has irregularities.

[Application Example of Through Electrode Substrate]

Figure 23:
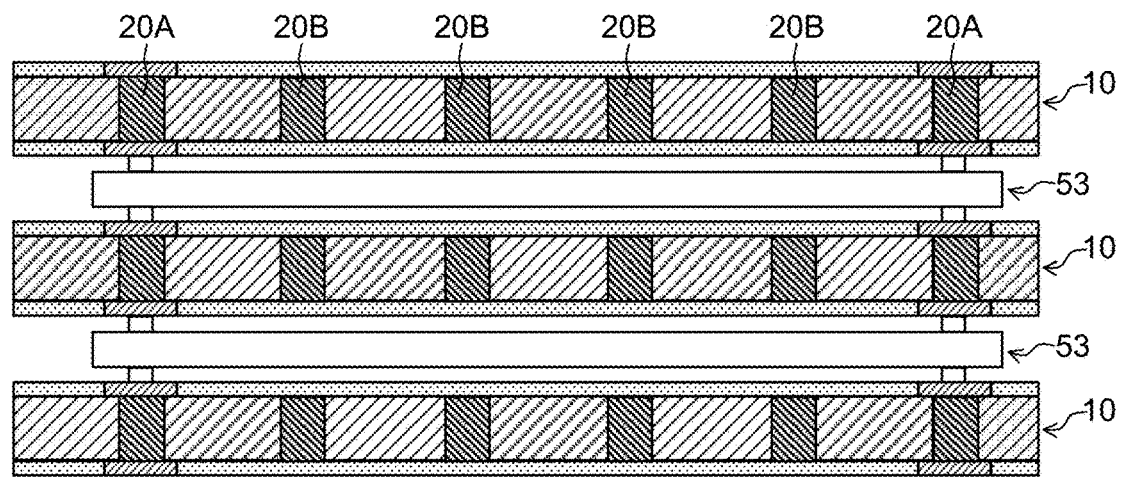
FIG. 23 is a view showing an example in which a through electrode substrate according to the embodiment of this disclosure is used as an interposer.

Herebelow, an example in which the through electrode substrate 10 according to the embodiment is used as an interposer is described with reference to FIG. 23. FIG. 23 is a sectional view showing a device 55 comprising the through electrode substrate 10 according to the embodiment.

The device 55 comprises a plurality of elements 53 such as stacked LSI chips, and the through electrode substrate 10 interposed between the two elements 53. Terminals 54 of the element 53 are connected to the electrode parts 31 and 36 electrically connected to the hole electrode parts 22 provided on the first holes 20A of the through electrode substrate 10.

The element 53 mounted on the through electrode substrate 10 is not limited to an active element such as an LSI chip. The element 53 mounted on the through electrode substrate 10 may be a passive element such as a resistor or an inductor.

[Examples of Product on which Through Electrode Substrate is Mounted]

Figure 24:
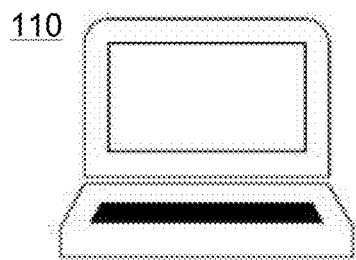
FIG. 24 is a view showing an example of a product on which the through electrode substrate according to the embodiment of this disclosure is mounted.
Figure 24:
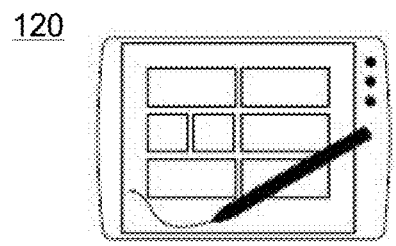
Figure 24:
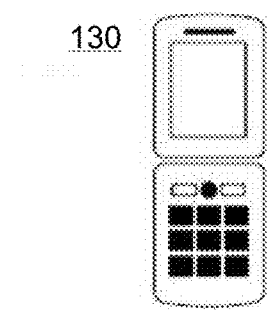
Figure 24:
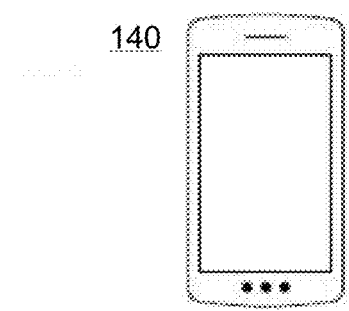
Figure 24:
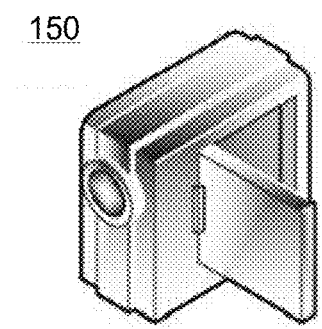
Figure 24:
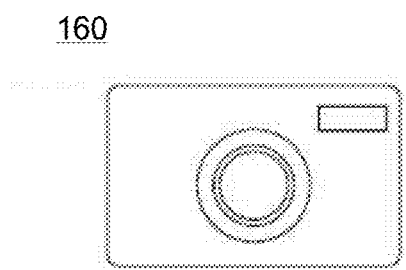
Figure 24:
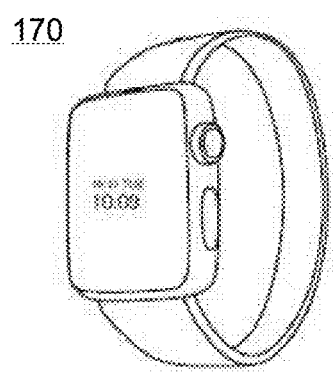

FIG. 24 is a view showing examples on which the through electrode substrate 10 according to the embodiment can be mounted. The through electrode substrate 10 according to the embodiment can be used in various products. For example, the through electrode substrate 10 can be mounted on a note-type personal computer 110, a tablet terminal 120, a mobile phone 130, a smart phone 140, a digital video camera 150, a digital camera 160, a digital watch 170 and so on.

DESCRIPTION OF REFERENCE NUMERALS

10 Through electrode substrate
12 Substrate
13 First surface
14 Second surface
16 Hole-free area
20 Hole
20A First hole
20B Second hole
21 Sidewall
22 Hole electrode part
23 Hollow part
24 Bottom
25 Filling member
26 Gap
31 First electrode part
32 First wiring
33 First insulation layer
34 Dummy wiring
36 Second electrode part
37 Second wiring
38 Second insulation layer
39 Dummy wiring
41 Seed layer
41a First seed layer
41b Second seed layer
42 Plating layer
42a First plating layer
42b Second plating layer
42c Convex portion
43 Resist layer
50 Optical device
51 Light receiving element
52 Lens
53 Element
55 Device
60 Wafer

What is claimed is:

1. A through electrode substrate comprising:
a substrate including a first surface and a second surface positioned oppositely to the first surface, the substrate being provided with a plurality of holes;
a hole electrode part provided inside each of the holes of the substrate;
a first electrode part provided on a first surface side of the substrate; and
a second electrode part provided on a second surface side of the substrate,
wherein:
the plurality of holes include a plurality of first holes and a plurality of second holes;
the hole electrode part of each first hole is electrically connected to the first electrode part on the first surface side of the substrate, and the hole electrode part thereof is electrically connected to the second electrode part on the second surface side of the substrate; and
the hole electrode part of each second hole is electrically insulated from the first electrode part on the first surface side of the substrate, and the hole electrode part thereof is electrically insulted from the second electrode part on the second surface side of the substrate.

2. The through electrode substrate according to claim 1, wherein:
the through electrode substrate includes a first insulation layer provided on the first surface side of the substrate, and a second insulation layer provided on the second surface side of the substrate; and
the second holes are covered with the first insulation layer on the first surface side of the substrate, or covered with the second insulation layer on the second surface side of the substrate.

3. The through electrode substrate according to claim 2, further comprising:
a first dummy wiring provided on the first surface and covered with the first insulation layer, or a second dummy wiring provided on the second surface and covered with the second insulation layer,
wherein:
the hole electrode parts of the two second holes are electrically connected by the first dummy wiring or the second dummy wiring.

4. A through electrode substrate comprising:
a substrate including a first surface and a second surface positioned oppositely to the first surface, the substrate being provided with a plurality of holes;
a hole electrode part provided inside each of the holes of the substrate;
a first electrode part provided on a first surface side of the substrate; and
a second electrode part provided on a second surface side of the substrate,
wherein:
the plurality of holes include a plurality of first holes and a plurality of second holes;
the hole electrode part of each first hole is electrically connected to the first electrode part on the first surface side of the substrate, and the hole electrode part thereof is electrically connected to the second electrode part on the second surface side of the substrate;

the hole electrode part of each second hole is electrically insulated from the first electrode part on the first surface side of the substrate, or the hole electrode part thereof is electrically insulated from the second electrode part on the second surface side of the substrate;

the through electrode substrate includes a first insulation layer provided on the first surface side of the substrate, and a second insulation layer provided on the second surface side of the substrate; and the second holes are covered with the first insulation layer on the first surface side of the substrate, or covered with the second insulation layer on the second surface side of the substrate.

5. The through electrode substrate according to claim 4, further comprising:

a first dummy wiring provided on the first surface and covered with the first insulation layer, or a second dummy wiring provided on the second surface and covered with the second insulation layer, wherein:

the hole electrode parts of the two second holes are electrically connected by the first dummy wiring or the second dummy wiring.

6. A through electrode substrate comprising:

a substrate including a first surface and a second surface positioned oppositely to the first surface, the substrate being provided with a plurality of holes;

a hole electrode part provided inside each of the holes of the substrate;

a first electrode part provided on a first surface side of the substrate; and a second electrode part provided on a second surface side of the substrate, wherein:

the plurality of holes include a plurality of first holes and a plurality of second holes;

the hole electrode part of each first hole is electrically connected to the first electrode part on the first surface side of the substrate, and the hole electrode part thereof is electrically connected to the second electrode part on the second surface side of the substrate;

the hole electrode part of each second hole is electrically insulated from the first electrode part on the first surface side of the substrate, or the hole electrode part thereof is electrically insulated from the second electrode part on the second surface side of the substrate;

the hole electrode part includes an electroconductive layer provided on a sidewall of the hole; and the through electrode substrate further comprises a filling member provided inside the hole, the filling member being nearer to a center side of the hole than the hole electrode part.

7. The through electrode substrate according to claim 6, wherein:

the through electrode substrate includes the first insulation layer provided on the first surface side of the substrate, and the second insulation layer provided on the second surface side of the substrate; and at least one or more filling members of the filling members provided in the second holes are connected to the first insulation layer or the second insulation layer.

8. A through electrode substrate comprising:

a substrate including a first surface and a second surface positioned oppositely to the first surface, the substrate being provided with a plurality of holes;

a hole electrode part provided inside each of the holes of the substrate;

a first electrode part provided on a first surface side of the substrate; and a second electrode part provided on a second surface side of the substrate, wherein:

the plurality of holes include a plurality of first holes and a plurality of second holes;

the hole electrode part of each first hole is electrically connected to the first electrode part on the first surface side of the substrate, and the hole electrode part thereof is electrically connected to the second electrode part on the second surface side of the substrate;

the hole electrode part of each second hole is electrically insulated from the first electrode part on the first surface side of the substrate, or the hole electrode part thereof is electrically insulated from the second electrode part on the second surface side of the substrate; and the substrate has a hole-free area being present inside an area where the first holes and the second holes are arranged.

9. A through electrode substrate comprising:

a substrate including a first surface and a second surface positioned oppositely to the first surface, the substrate being provided with a plurality of holes;

a hole electrode part provided inside each of the holes of the substrate;

a first electrode part provided on a first surface side of the substrate; and a second electrode part provided on a second surface side of the substrate, wherein:

the plurality of holes include a plurality of first holes and a plurality of second holes;

the hole electrode part of each first hole is electrically connected to the first electrode part on the first surface side of the substrate, and the hole electrode part thereof is electrically connected to the second electrode part on the second surface side of the substrate;

the hole electrode part of each second hole is electrically insulated from the first electrode part on the first surface side of the substrate, or the hole electrode part thereof is electrically insulated from the second electrode part on the second surface side of the substrate; and the substrate has an aperture part passing through the substrate and being present inside an area where the first holes and the second holes are arranged.

10. A manufacturing method of a through electrode substrate on which an element having a plurality of terminals is mounted, the manufacturing method comprising:

a step of preparing a substrate including a first surface and a second surface positioned oppositely to the first surface;

a positioning step of determining positioning of a plurality of holes to be formed in the substrate;

a hole forming step of forming the plurality of holes in the substrate, based on the positioning determined in the positioning step; and a hole-electrode-part forming step of forming a hole electrode part inside each of the plurality of holes;

wherein the positioning step includes a first positioning step of determining positioning of a plurality of first holes to be electrically connected to the terminals of the element, and a second positioning step of determining positioning a plurality of second holes not to be electrically connected to the terminals of the element.

11. A manufacturing method of a through electrode substrate on which an element having a plurality of terminals is mounted, the manufacturing method comprising:
- a step of preparing a substrate including a first surface and a second surface positioned oppositely to the first surface;
- a hole forming step of forming the plurality of holes in the substrate,
- a hole-electrode-part forming step of forming a hole electrode part inside each of the plurality of holes,
- an insulation-layer forming step of forming a first insulation layer on the first surface of the substrate, and forming a second insulation layer on the second surface of the substrate, and
- an electrode-part forming step of forming a first electrode part in an aperture part of the first insulation layer, and forming a second electrode part in an aperture part of the second insulation layer;
- wherein:
- the plurality of holes include a plurality of first holes and a plurality of second holes;
- the hole electrode part of each first hole is electrically connected to the first electrode part on the first surface side of the substrate, and the hole electrode part thereof is electrically connected to the second electrode part on the second surface side of the substrate; and
- the hole electrode part of each second hole is electrically insulated from the first electrode part on the first surface side of the substrate, or the hole electrode part thereof is electrically insulated from the second electrode part on the second surface side of the substrate,
- the second holes are covered with the first insulation layer on the first surface side of the substrate, or covered with the second insulation layer on the second surface side of the substrate,
- the through electrode substrate further comprise a first dummy wiring provided on the first surface and covered with the first insulation layer, or a second dummy wiring provided on the second surface and covered with the second insulation layer, and
- the hole electrode parts of the two second holes are electrically connected by the first dummy wiring or the second dummy wiring.

* * * * *